United States Patent
Kuznetsov et al.

(10) Patent No.: US 7,827,464 B2
(45) Date of Patent: Nov. 2, 2010

(54) ITERATIVE READ CHANNEL ARCHITECTURES WITH CODED MODULATION

(75) Inventors: Alexander V. Kuznetsov, Pittsburgh, PA (US); Xueshi Yang, Sunnyvale, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 1022 days.

(21) Appl. No.: 11/599,711

(22) Filed: Nov. 15, 2006

(65) Prior Publication Data

US 2008/0115036 A1    May 15, 2008

(51) Int. Cl.
*H03M 13/29* (2006.01)
*G11B 20/18* (2006.01)

(52) U.S. Cl. ...................... 714/755; 714/778
(58) Field of Classification Search ............... 714/752, 714/755, 778
See application file for complete search history.

(56) References Cited

U.S. PATENT DOCUMENTS

| | | | | |
|---|---|---|---|---|
| 5,544,178 A * | 8/1996 | Zook | ............................ | 714/786 |
| 5,812,601 A | 9/1998 | Schramm | ..................... | 375/262 |
| 5,970,098 A | 10/1999 | Herzberg | .................... | 375/264 |
| 6,014,411 A | 1/2000 | Wang | .......................... | 375/259 |
| 6,505,320 B1 * | 1/2003 | Turk et al. | ................... | 714/755 |
| 6,600,431 B1 | 7/2003 | Shim et al. | ..................... | 341/59 |
| 6,631,490 B2 * | 10/2003 | Shimoda | ..................... | 714/755 |
| 6,704,368 B1 | 3/2004 | Nefedov | ..................... | 375/265 |
| 6,748,079 B1 | 6/2004 | Downing | .................... | 380/201 |
| 6,751,269 B1 | 6/2004 | Shalvi et al. | ................. | 375/298 |
| 6,829,742 B1 | 12/2004 | Jung et al. | ................... | 714/790 |
| 6,865,236 B1 | 3/2005 | Terry | .......................... | 375/279 |
| 6,895,547 B2 | 5/2005 | Eleftheriou et al. | .......... | 714/801 |
| 6,985,536 B2 | 1/2006 | Oelcer et al. | ................ | 375/261 |
| 7,000,167 B2 | 2/2006 | Coker et al. | ................ | 714/752 |
| 7,030,789 B1 * | 4/2006 | Cideciyan et al. | ............. | 341/83 |
| 7,174,485 B2 * | 2/2007 | Silvus | .......................... | 341/59 |
| 7,205,912 B1 * | 4/2007 | Yang et al. | ..................... | 341/59 |
| 7,245,236 B2 * | 7/2007 | Izumita et al. | ................. | 341/59 |
| 7,290,184 B2 * | 10/2007 | Bruner et al. | ................ | 714/704 |
| 7,546,509 B2 * | 6/2009 | Kim et al. | .................... | 714/755 |
| 7,568,144 B1 * | 7/2009 | Feng et al. | ................... | 714/758 |
| 7,714,748 B1 * | 5/2010 | Chaichanavong | ............. | 341/58 |
| 2001/0028684 A1 | 10/2001 | Chung et al. | ................. | 375/261 |
| 2002/0136317 A1 | 9/2002 | Oelcer et al. | ................ | 375/261 |
| 2003/0037298 A1 | 2/2003 | Eleftheriou et al. | .......... | 714/752 |

(Continued)

FOREIGN PATENT DOCUMENTS

EP    1 143 653 A2    3/2001

(Continued)

OTHER PUBLICATIONS

Xueshi Yang et al., "Structured Set Partitioning and Multilevel Coding for Partial Response Channels," U.S. Appl. No: 11/263,128, filed Oct. 31, 2005, pp. 1-48.

*Primary Examiner*—Stephen M Baker
(74) *Attorney, Agent, or Firm*—Westman, Champlin & Kelly, P.A.

(57) ABSTRACT

Iterative decoding channel architectures employing coded modulation are provided. The coded modulation is realized via set partitioning for Partial Response (PR) channels along with multi-level coding. Associated error correction encoding and decoding methods, with additional compatibility considerations for channel constrained coding, are also provided.

18 Claims, 21 Drawing Sheets

U.S. PATENT DOCUMENTS

| | | | |
|---|---|---|---|
| 2003/0074626 A1 | 4/2003 | Coker et al. | 714/752 |
| 2004/0117720 A1 | 6/2004 | Choi et al. | 714/792 |
| 2004/0136313 A1 | 7/2004 | Goldstein et al. | 370/203 |
| 2004/0139378 A1 | 7/2004 | Akhter et al. | 714/755 |
| 2005/0149843 A1 | 7/2005 | Shen et al. | 714/800 |

FOREIGN PATENT DOCUMENTS

| | | |
|---|---|---|
| WO | WO 98/23073 | 5/1998 |

* cited by examiner

ITERATIVE READ CHANNEL ARCHITECTURES WITH CODED MODULATION

FIELD OF THE INVENTION

The present embodiments relate generally to encoding and decoding in data storage and/or communication systems. More particularly, the present embodiments relate to utilizing coded modulation in systems with iterative soft and hard decoding of single parity codes, multiple turbo-product codes, low density parity check codes and other codes defined on graphs.

BACKGROUND OF THE INVENTION

Various types of iterative detection schemes operating with soft decisions regarding transmitted data have been proposed for communication channels and data storage systems. These schemes can utilize convolutional codes, Low Density Parity Check (LDPC) codes or Turbo-Product Codes (TPCs) to add redundant parity bits to original data and exploit them at a receiver side. Combined with a soft channel detector, for example, a Soft-Output Viterbi Algorithm (SOVA), these codes provide flexible tradeoffs in complexity, Bit Error Rate (BER), and Sector Failure Rates (SFR). Despite increasing latency in a decoding process, such iterative detection schemes are attractive solutions for designing advanced communication systems and high-density magnetic recording applications.

In optical and magnetic storage systems, as well as in some other communication systems, data are usually first encoded by an outer Error Correcting Code (ECC), then sent to a modulation encoder that introduces certain input constraints, and finally go to a channel encoder. The modulation encoder could be of a Run Length Limiting (RLL) type, a Running Digital Sum limiting (RDS) type or a Direct Current Free (DCF) type. A primary task of a modulation encoder is to facilitate operation of front-end stages of a channel, such as a preamplifier, a timing circuit, an equalizer, etc. This is usually achieved by creating a necessary structure in an encoded bit stream, for example, by preventing an imbalance of zeros and ones which can result in significant Direct Current (DC) content in a received analog signal. At the same time, the task of channel codes, such as an LDPC code or a TPC, is to guarantee required BER and SFR characteristics of a channel by introducing additional redundancy in transmitted data.

Channel coding and signal modulation can be implemented independently, using separate modulation and channel codes, or in a combined manner. In the latter case, a refined Euclidean distance structure of signals at an output of a channel is taken into consideration. This approach was originally developed for channels without memory and became well known as coded modulation. It jointly optimizes modulation (signal mapping) and coding so that the code is optimized in Euclidean space rather than with traditional Hamming distances. Free Euclidean distances, rather than Hamming distances define system performance, in particular, at SNR regions that are of practical interest. A key element of coded modulation is "set partition." Set partition, as its name suggests, involves partitioning a signal constellation of a system of interest into many small subsets in a systematic manner. The assignment of signal subsets to represent coded bits is carried out to optimize Euclidean distances of received signals. Set partitioning usually coexists well with multi-level coding (MLC), which generates corresponding coded bits. Multi-level signal constellation is available for typical transmission channels without memory.

However, for magnetic recording channels, binary saturated recording is usually a most practical channel signaling method. Such binary saturated channels are examples of channels with inter-symbol interference (ISI). By equalization, an ISI channel is often converted to so-called Partial-Response (PR) channels with simple trellis representations. When represented by a trellis, a PR channel became a channel with memory. The application of coded modulation in channels with memory (for example, in PR channels) requires structured set partitions.

However, combining set partitioning and multi-level channel coding, and their application in storage and communication systems employing iterative detection and decoding, are non-trivial problems that need to be addressed.

Embodiments of the present invention provide solutions to these and other problems, and offer other advantages over the prior art.

SUMMARY OF THE INVENTION

The present embodiments relate to iterative read channel architectures with coded modulation which address the above-mentioned problems.

The present embodiments include an encoding system. The encoding system includes a first encoding component configured to receive user information bits and to responsively output an original RLL/RDS bit sequence corresponding to the user information bits. A second encoding component receives the original RLL/RDS bit sequence and responsively generates parity bits. A concatenation component appends the original RLL/RDS bit sequence and the generated parity bits.

Also provided is a data detection apparatus. The data detection apparatus includes at least one Sectioned Soft-Output Viterbi Algorithm (S-SOVA) detector for processing channel bits and intermediate bits. The S-SOVA detector includes a path memory structure utilized for updating hard information and soft information for the channel bits and the intermediate bits.

These and other features and benefits that characterize embodiments of the present invention will be apparent upon reading the following detailed description and review of the associated drawings.

DETAILED DESCRIPTION OF ILLUSTRATIVE EMBODIMENTS

Disclosed here are iterative decoding channel architectures employing coded modulation. The coded modulation is realized via set partitioning for Partial Response (PR) channels along with multi-level coding. Associated error correction encoding and decoding methods, with additional compatibility considerations for channel constrained coding are also described. Numerical simulations on perpendicular magnetic recording show superior performance over conventional comparable iterative channels by SNR gains of more than 0.5 dB measured by sector-failure rates (SFR).

Figure 1:
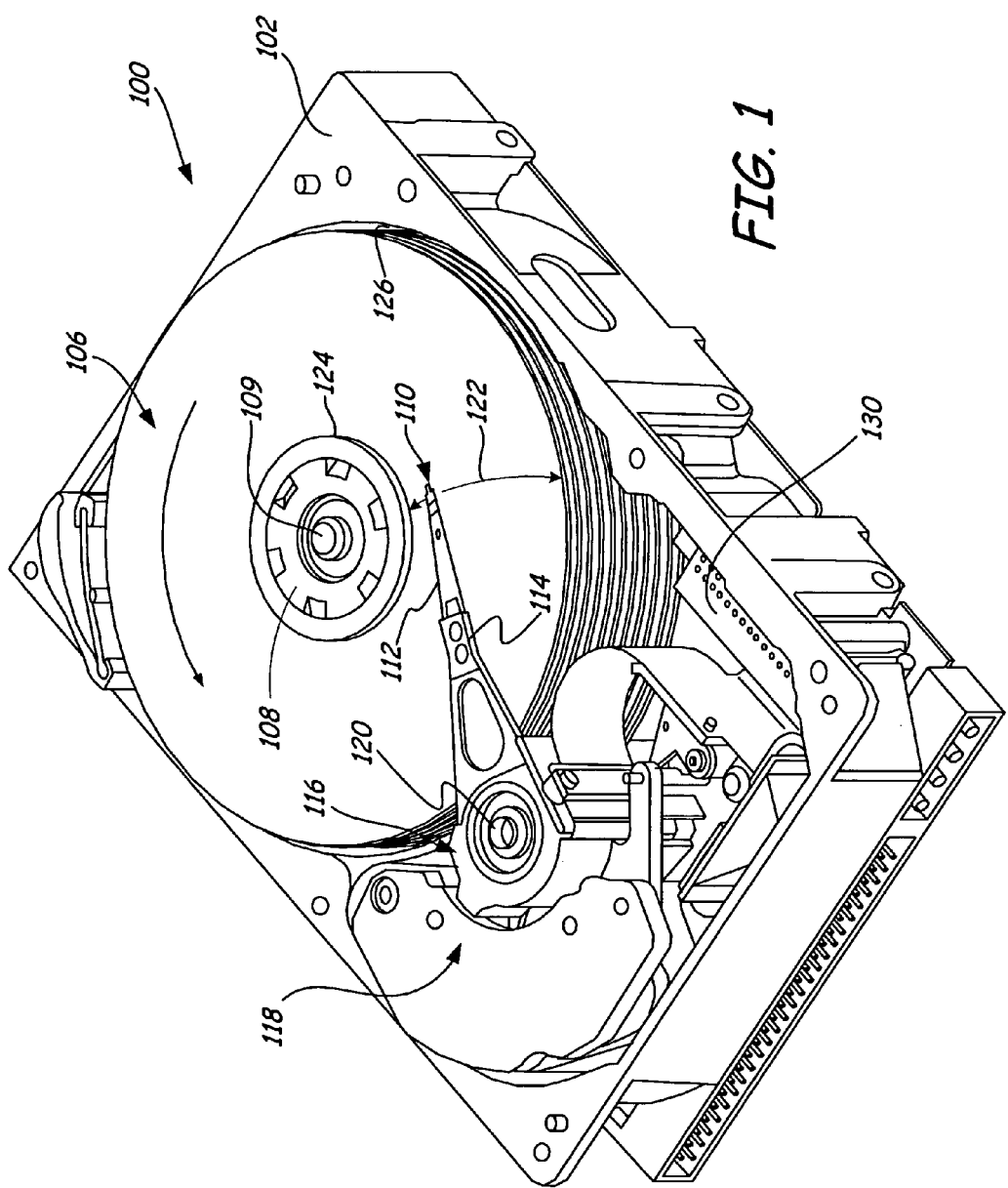
FIG. 1 is an isometric view of a disc drive in which the present embodiments are useful.

FIG. 1 is an isometric view of a disc drive 100 in which the present embodiments are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

Figure 2:
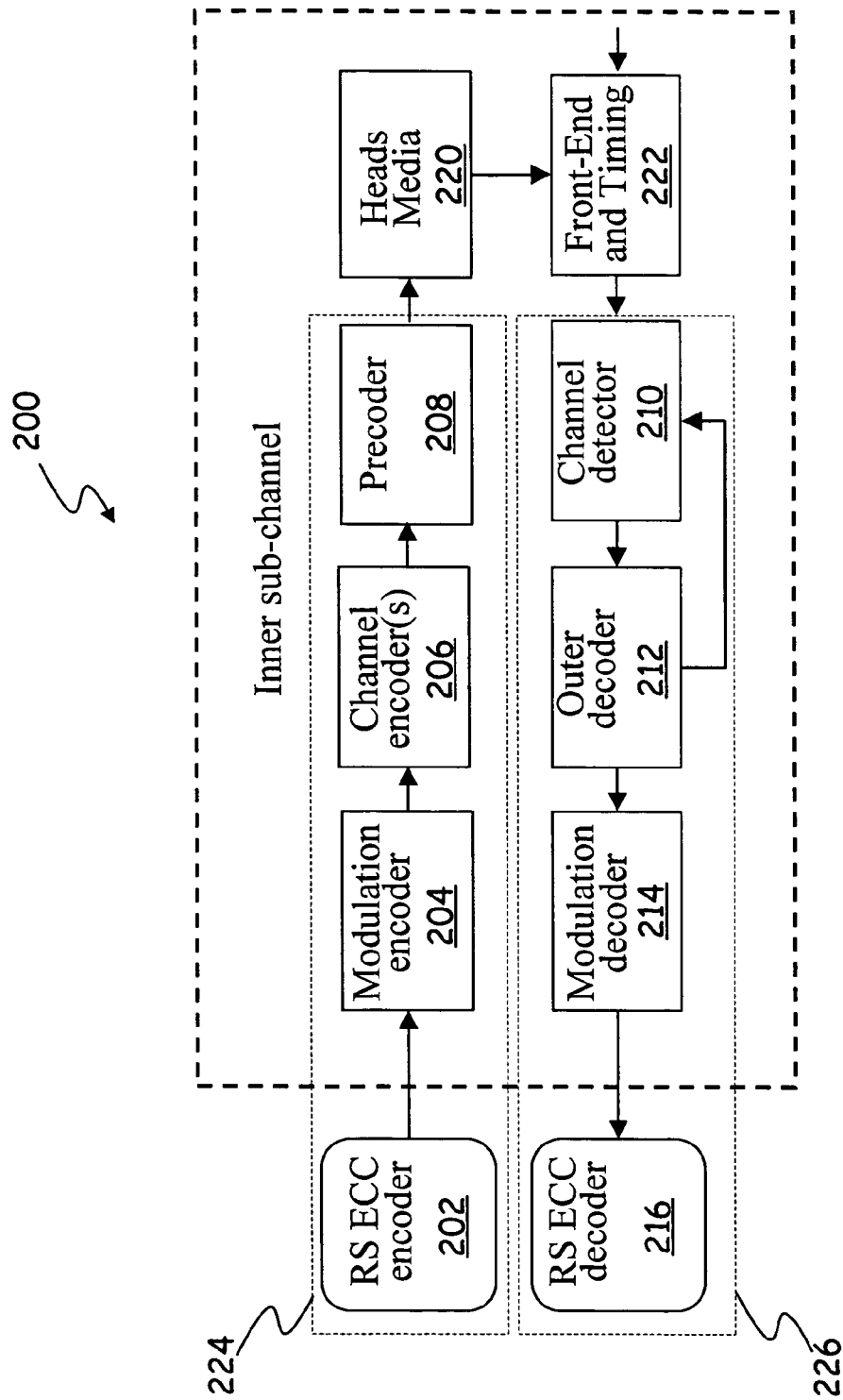
FIG. 2 is a simplified block diagram illustrating an architecture of a read/write channel in which the present embodiments can be implemented.

Read/Write channels of magnetic and/or optical disk drives (such as 100 of FIG. 1) are primary targets of some of the present embodiments. FIG. 2 shows a simplified block diagram of such a channel 200. It includes a number of different encoding/decoding circuits (Error Correcting Code (ECC) encoder 202, modulation encoder 204, channel encoder(s) 206, precoder 208, channel detector 210, outer decoder 212, modulation decoder 214 and ECC decoder 216), each encoding or decoding data in a different manner for a different purpose. Also included in channel 200 are heads and media 220 (shown separately as heads 110 and media 106 in FIG. 1) and front-end and timing component 222. The various circuits shown in this figure can be implemented as integrated circuits, discrete components, or suitably programmed processing circuitry. The present embodiments relate mainly to architectures of encoding side 224 and decoding side 226 of channel 200, and methods of encoding and decoding associated with these architectures. Therefore, a general description of the operation of read/write channel components, which is known in the art, has not been included. However, details of the specific novel architectures are described at length below.

Regarding encoding side 224, a description of how Run Length Limiting (RLL)/Running Digital Sum limiting (RDS) encoders, set partitioning encoders (or Structured Set Partitioning (SSP) modems), permuters (or interleavers) and multiple channel encoders can be integrated into one system for encoding user bits to channel bits, is provided. Here, channel bits (in Nonretum-to-Zero (NRZ) format) correspond to binary magnetization states recorded in magnetic media. For decoding side 226 of channel 200, a description of methods and apparatus for iteratively decoding received signal samples into user bits is provided. Key enabling components for iterative decoding of coded modulation systems include a sectioned soft-output Viterbi algorithm (S-SOVA) with embedded modems, an inhomogeneous SOVA, and a new class of high-rate Turbo Product Codes (HR-TPCs). These critical components with associated encoding and decoding methods are described below in detail.

Figure 3:
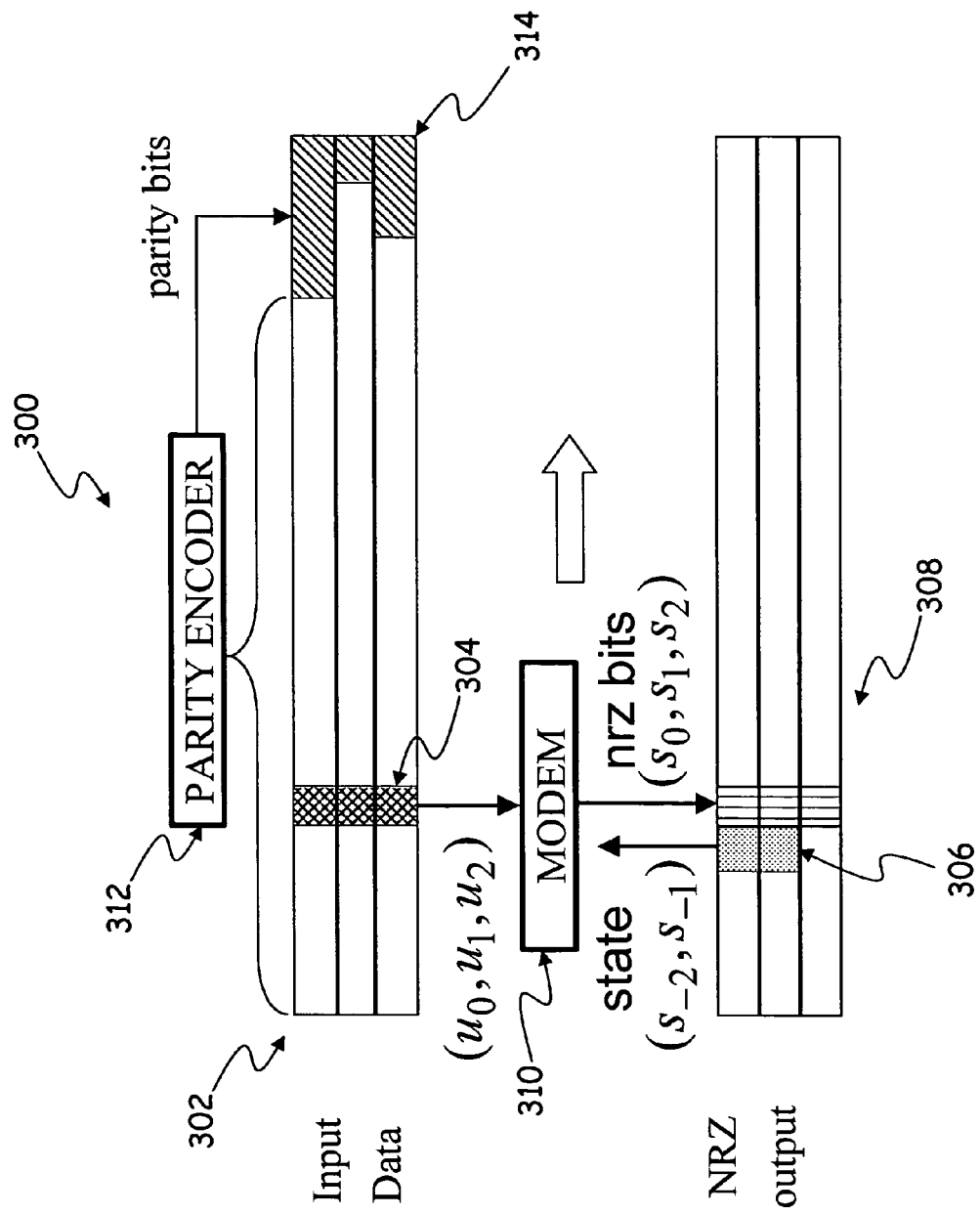
FIG. 3 is a diagrammatic illustration of a modulation method that utilizes a Structured Set Partitioning (SSP) modem to convert a 2-dimensional coded data array to a sequence of channel Non return-to-Zero (NRZ) bits.

Structured Set Partitions for Partial-Response (PR) Channels with Multi-level Iteratively-decodable Encoding It is known that, via proper structured set partitioning (SSP) of output signals of a PR channel, user information bits can obtain different levels of significance. For example, for 3-level SSP, a block of user bits ($u_0$, $u_1$, $u_2$) have three different levels of error probability if there is no other outer coder imposed besides SSP. After SSP, first bit $u_0$ has a least significance and it is more prone to error than $u_1$ and $u_2$. Last bit $u_2$ has a most significance and it is more immune to error than both $u_0$ and $u_1$. The essence of multi-level coding is to protect each bit $u_i$ differently via individual binary or q-ary error correcting codes according to their significance. FIG. 3 illustrates a 3-level SSP coding process 300, in which input data 302 is arranged in matrix form, and encoded by multiple error correcting codes row-wise. The rows may have different numbers of parity bits. Parity encoder 312 utilizes input data 302 to produce parity bits 314, which are concatenated to input row data 302. Conversion of this matrix to NRZ bits is performed column-wise. During this conversion, three bits (denoted by reference numeral 304) from one column of input data matrix 302 along with two prior NRZ bits 306 from modem output 308 are input to modem logic 310 and, subsequently, three output NRZ bits are generated. This procedure is repeated until all the encoded input data are converted to NRZ bits.

Figure 4:
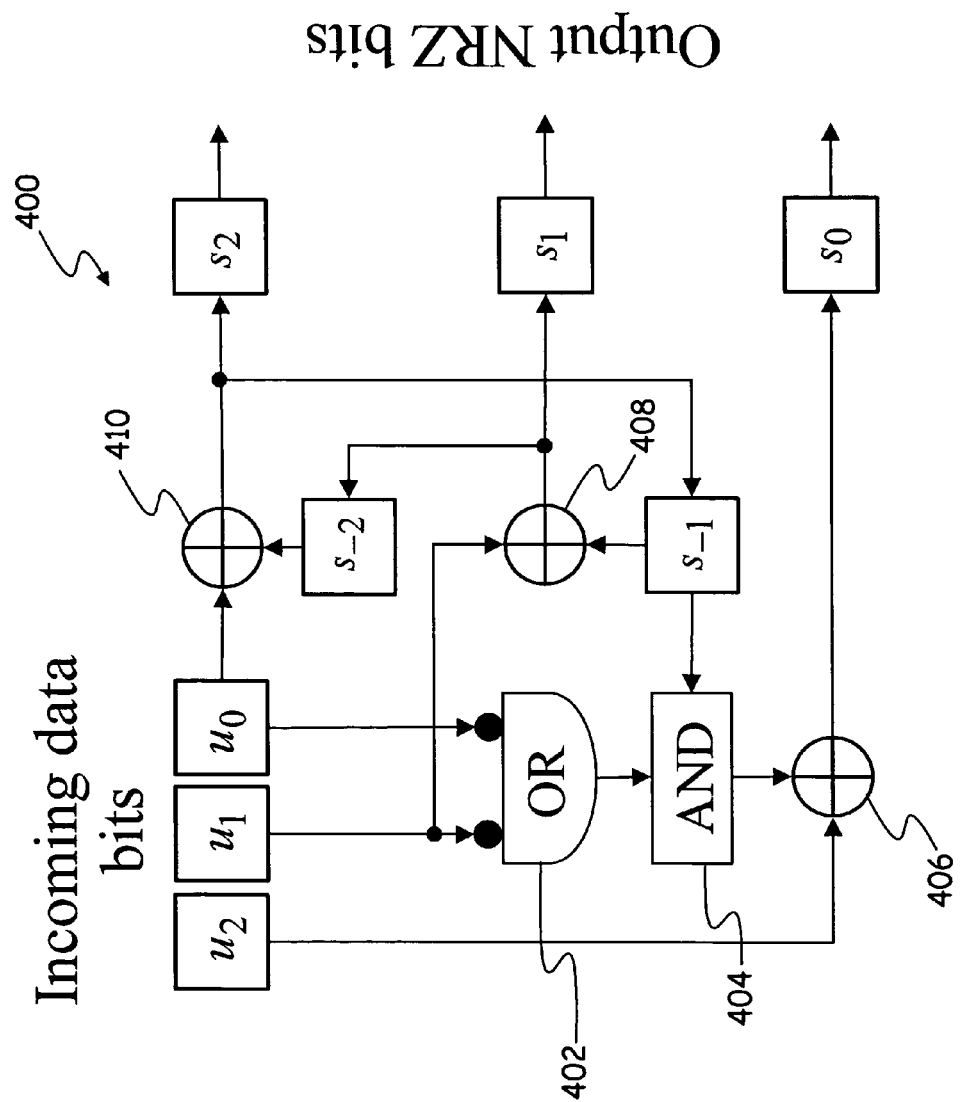
FIG. 4 is a diagrammatic illustration of a modem for 3-level coded modulation that converts 3-tuples of input bits to three consecutive channel NRZ bits.

FIG. 4 is an illustrative example of a modem logic 400 designed for a specific 3-level set partition of signals at an output of a PR channel with a target of length 3. As can be seen in FIG. 4, modem logic 400 includes an OR logic component 402, an AND logic component 404, a first summing node 406, a second summing node 408 and a third summing node 410. OR logic component 402 receives inputs $u_0$ (first user bit) and $u_1$ (second user bit) and provides its output to AND logic component 404, which also receives, as an input, a first prior modem output bit $S_{-1}$. An output from AND logic component 404 and third user bit $u_2$ are provided to first summing node 406, which provides a current modem output bit $S_0$. Similarly, $u_1$ and $S_{-1}$ are provided to second summing node 408, which, in turn, provides a current modem output bit $S_1$. Also, $u_0$ and a second prior modem output bit $S_{-2}$ are provided to third summing node 410, which provides a current modem output bit $S_2$.

Figure 5:
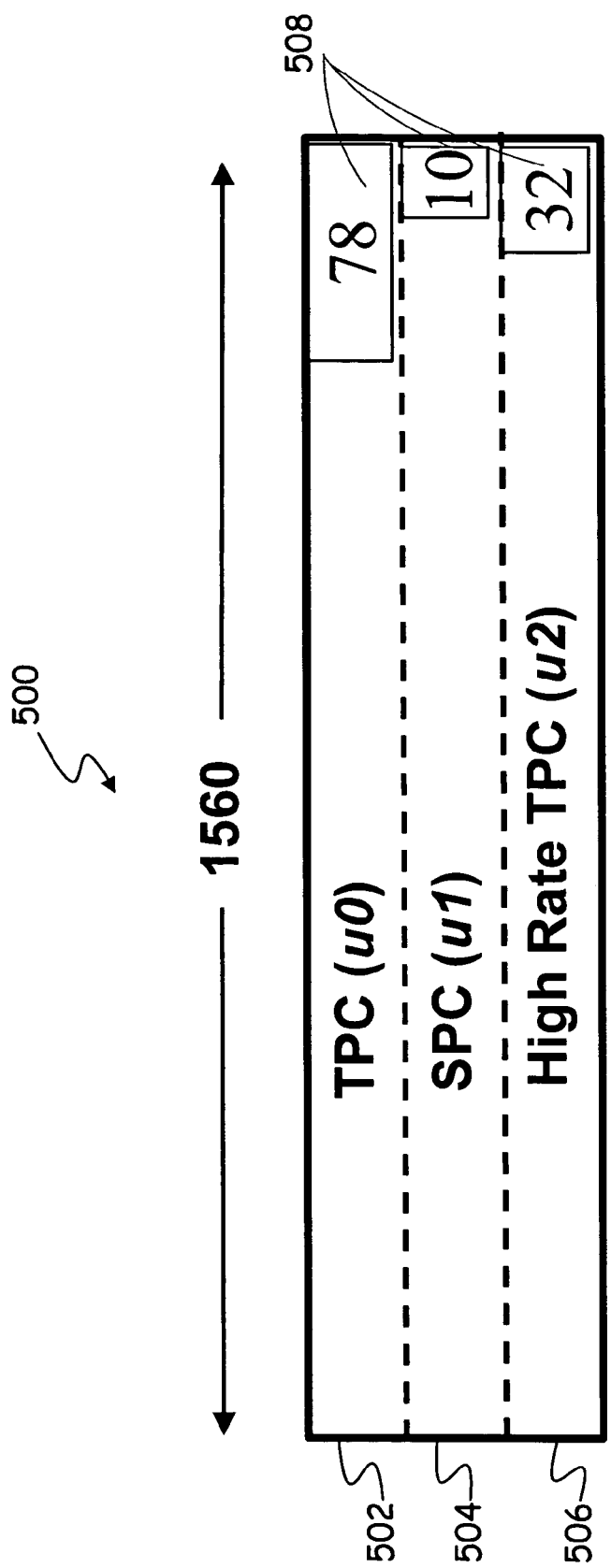
FIG. 5 is a diagrammatic illustration of an example of a code matrix which can be used with 3-level set partition and constructed from two types of Turbo-Product Codes (TPCs) with different error correction capabilities and Single Parity Codes (SPCs).

FIG. 5 is an illustrative example of a code matrix 500 for a data sector which can be used with 3-level set partitions and constructed from two types of TPCs with different error correction capabilities and an SPC code. A first row 502 of code matrix 500 includes a collection of bits corresponding to $u_0$, the least significant bits, while a second row 504 and a third row 506 include bits corresponding to $u_1$ and $u_2$, respectively. Parity bits are denoted by reference numeral 508.

Figure 6:
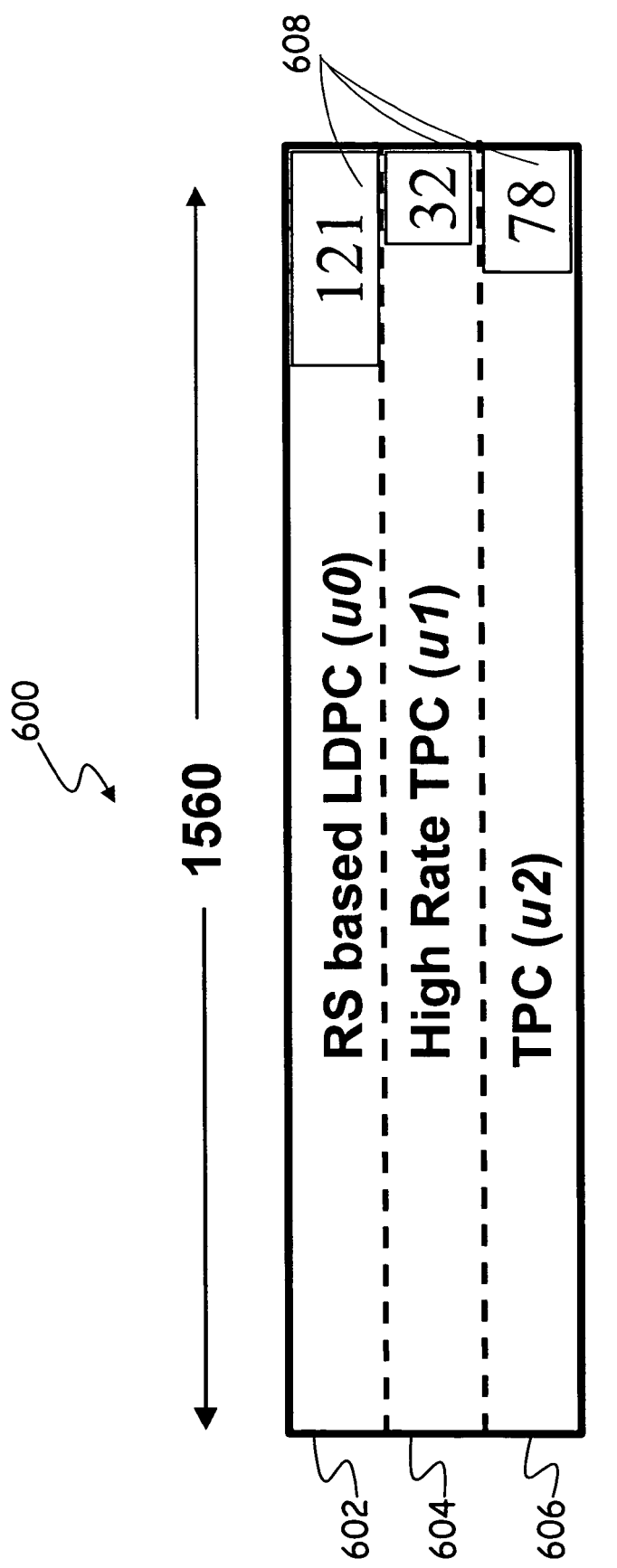
FIG. 6 is a diagrammatic illustration of an example of a code matrix which can be used with 3-level set partitions and constructed from a structured Low Density Parity Check (LDPC) code and two TPCs with different error correction capabilities.

FIG. 6 is an illustrative example of a code matrix 600 for a data sector which can be used with 3-level set partitions and constructed from a structured LDPC code and two TPCs with different error correction capabilities. Similar to FIG. 3, a first row 602 of code matrix 600 includes bits corresponding to $u_0$, while a second row 604 and a third row 606 include bits corresponding to $u_1$ and $u_2$, respectively. Parity bits are denoted by reference numeral 608.

Figure 7:
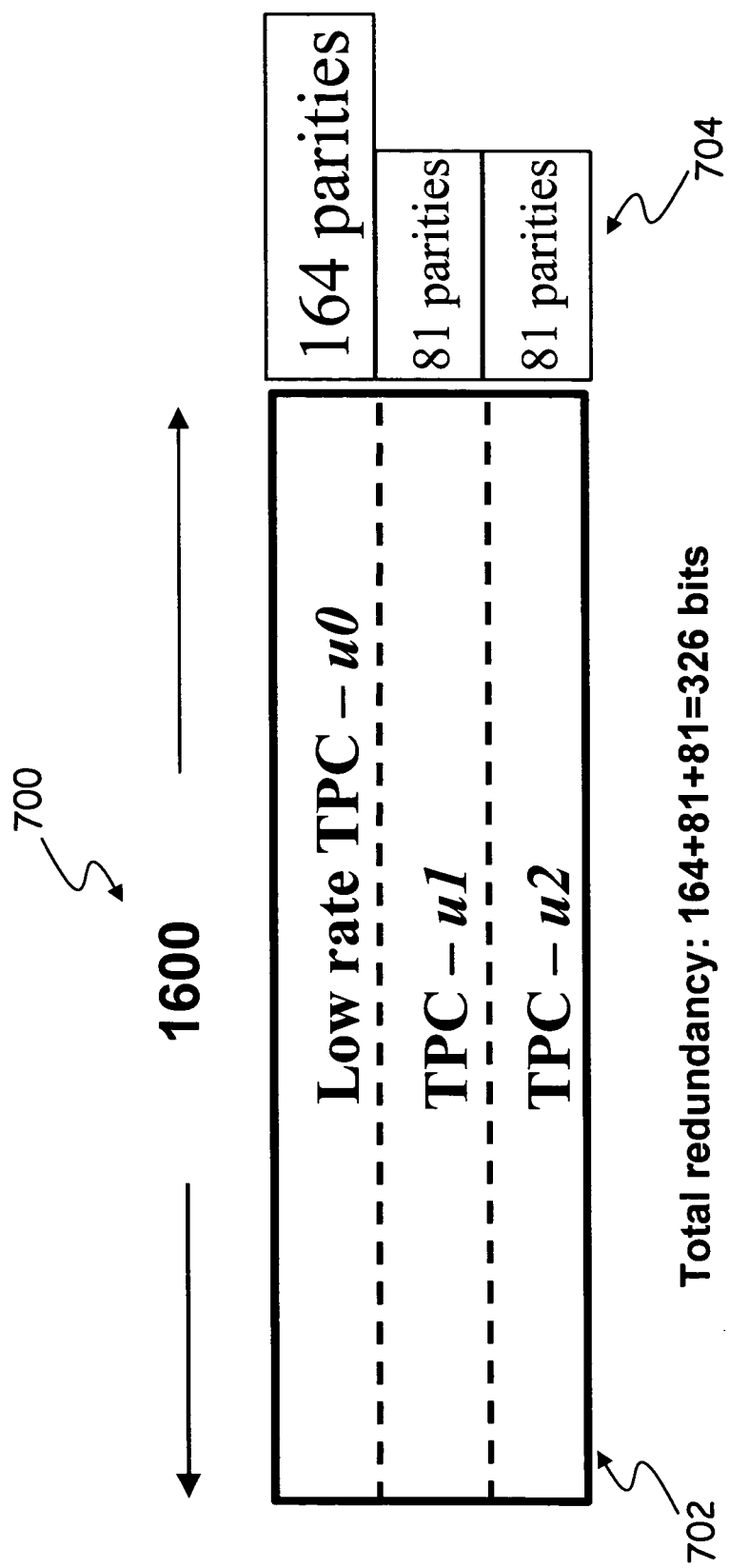
FIG. 7 is a diagrammatic illustration of an example of a code matrix which can be used with 3-level set partitions and constructed from two different TPCs.

FIG. 7 is an illustrative example of a code matrix 700 for a data sector which can be used with 3-level set partitions and constructed from a low rate TPC and two TPC code words. A difference from FIG. 5 and FIG. 6 is that only information bits 702 of code words have structured reliability and they correspond to $u_0$, $u_1$ and $u_2$, respectively. Parities 704 may or may not have structured reliability, depending on whether an optional SSP encoding is exercised on these parities.

Figure 8:
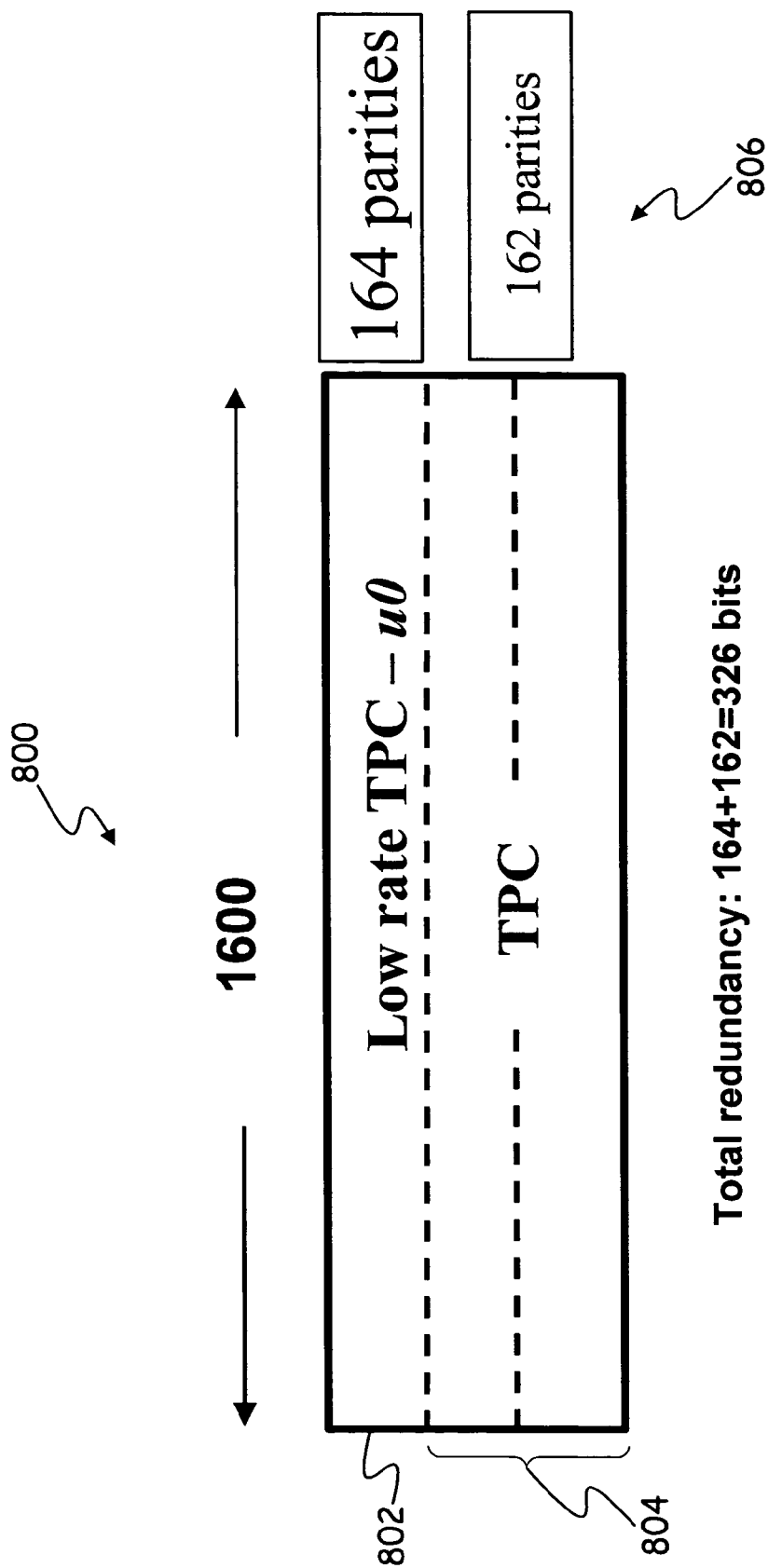
FIG. 8 is a diagrammatic illustration of an example of a code matrix which can be used with 3-level set partitions and constructed from two different TPCs.

FIG. 8 is an illustrative example of a code matrix 800 for a data sector which can be used with 3-level set partitions and constructed from a low rate TPC and a TPC. It is different from FIG. 7 because data bits corresponding to $u_1$ and $u_2$ are combined for encoding. Reference numeral 802 denotes data bits corresponding to $u_0$ and reference numeral 804 denotes data bits corresponding to $u_1$ and $u_2$. Parities are denoted by reference numeral 806.

Encoding Methods and Apparatus for RLL/RDS and Coded Modulation

In a conventional communication channel employing coded modulation (without RLL, DCF encoding or interleaving), SSP encoding, as shown in FIG. 3, is generally a last encoding step in a transmitter side. Such an encoding architecture is not desired for magnetic recording channels, where an additional constraint on transmitted bits is necessary to insure proper functionality of a read channel. In particular, if SSP encoding is performed in a last step after RLL/RDS encoding, it nullifies a constraint enforced by RLL/RDS encoders. To preserve RLL/RDS and other input constraints, schemes shown in FIG. 9 and FIG. 10 are proposed.

Figure 9:
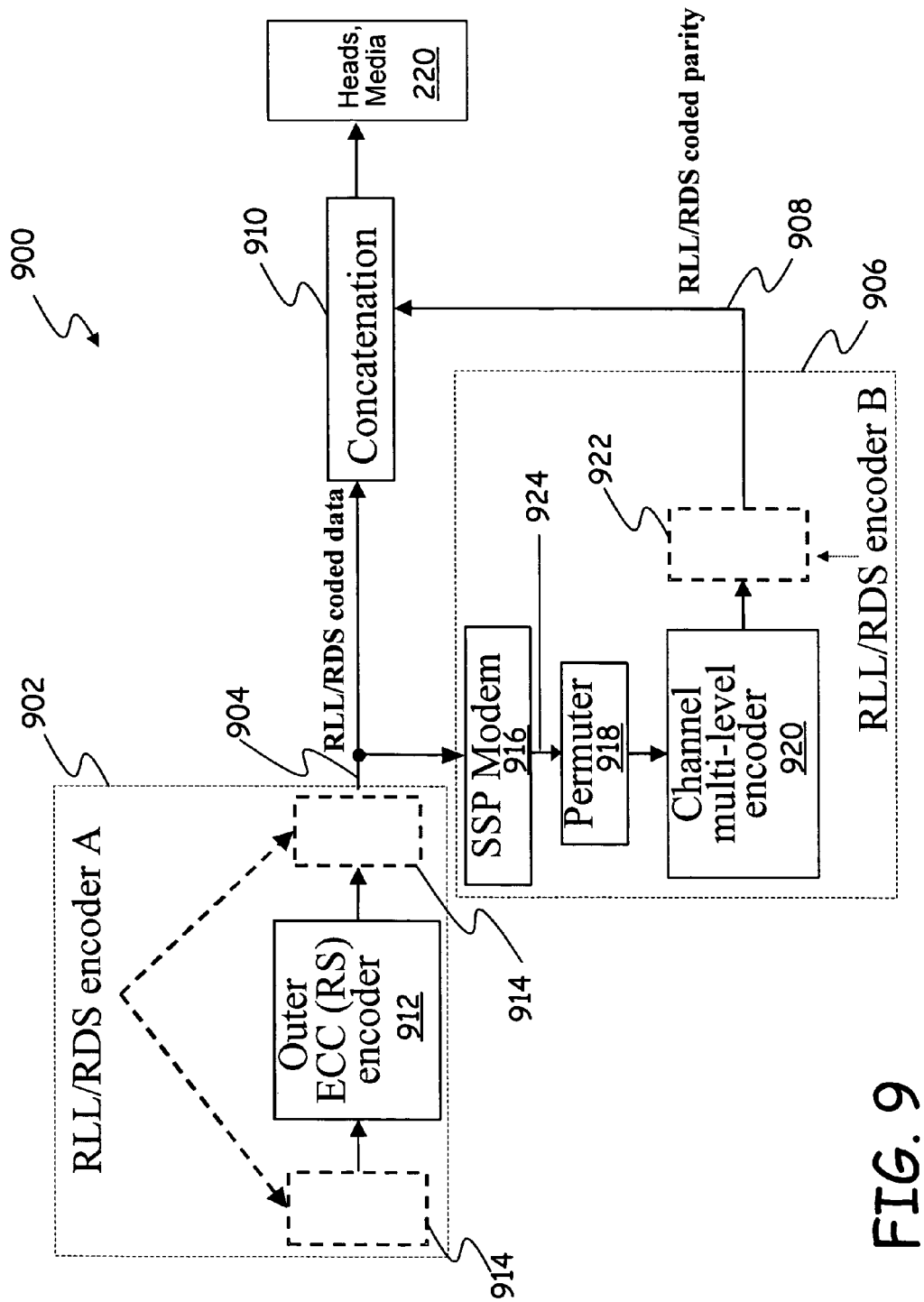
FIG. 9 is a simplified block diagram of an encoding side of an iterative channel that uses an SSP modem, a permuter, a multi-level channel encoder and an RLL/RDS encoder.
Figure 10:
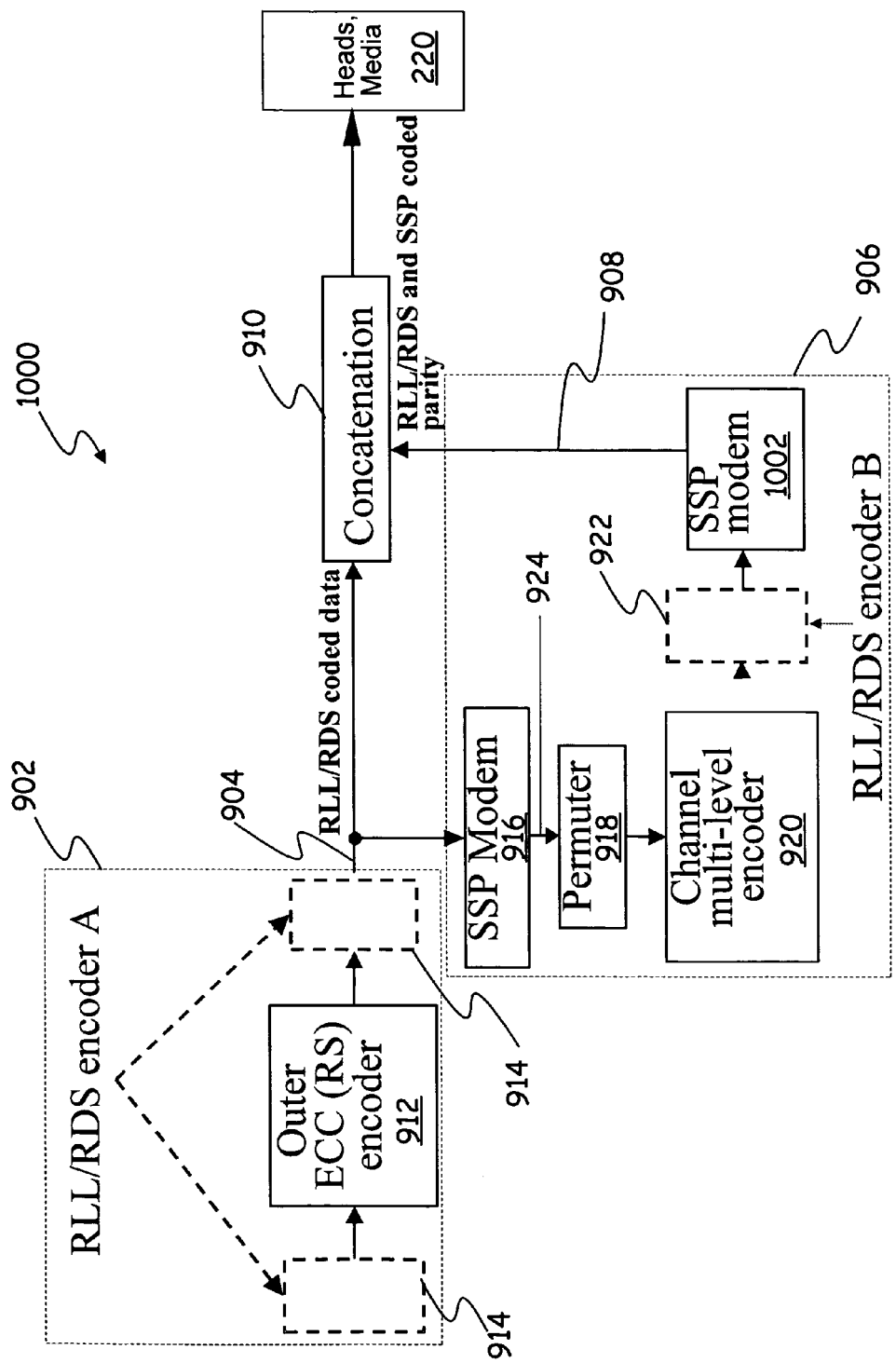
FIG. 10 is a simplified block diagram of an encoding side of an iterative channel that uses two SSP modems, a permuter, a multi-level channel encoder and an RLL/RDS encoder.

FIG. 9 is a simplified block diagram of an encoding scheme or system 900. Encoding system 900 includes as its primary components a first encoding component 902, a second encoding component 906 and a concatenation component 910 that appends together outputs 904 and 908 of components 902 and 906, respectively. In the embodiment shown in FIG. 9, first encoding component 902 includes an ECC encoder 912 and a first constraint encoder such as first RLL/RDS encoder 914, which can be on either side of ECC encoder 912. Second encoding component 906 includes a first SSP modem 916, a permuter 918, a channel multi-level encoder 920 and a second constraint encoder such as second RLL/RDS encoder 922.

Using system 900, encoding is accomplished as follows. First, user information bits are encoded by outer ECC Reed-Solomon (RS) encoder 912 and a constraint encoder such as first RLL/DCF encoder 914. An RLL/DCF encoded bit sequence (or first constraint encoded bit sequence) 904, output from first encoding component 1002, is directly transmitted to the channel and, at the same time, mapped to intermediate bits 924 using SSP-modem 916 that performs a reverse (decoding) operation. Intermediate bits 924 now become information bits for iterative encoding. SSP decoded bits or intermediate bits 924 possess structured reliability. Therefore, multiple component codes can be applied to the different rows, of an intermediate-bit matrix, that have different reliability. Here, component codes are selected to balance a spectrum of minimum Euclidian distances provided by structured set partition and error correction capabilities of component codes. Parity bits generated by multi-level encoder 920 are subsequently converted to channel bits using optional second RLL/RDS encoder 922, if required. RLL/RDS encoded parities (or second constraint encoded bit sequence) 908 are combined, by a multiplexer (for example, concatenation component 910), to first RLL/RDS encoded (or constraint encoded) bit sequence 904. Via such an encoding scheme, minimum disturbance results from the SSP/MLC encoding and bit sequences still satisfy RLL/DCF constraints.

In another embodiment, generated parities are inserted back into the RLL/DCF encoded sequence systematically, which may slightly relax the original RLL/RDS constraint.

In yet another embodiment, as shown in FIG. 10 (encoder 1000), there is a second SSP modem (encoding) 1002, following second RLL/RDS encoder 922, to convert parities into channel bits. Second RLL/RDS encoder 922 is designed such that the bits after SSP encoding still satisfy RLL/RDS constraints. An advantage of such a scheme is that a SOVA detector required for decoding is homogeneous, which is in contrast to the previous cases that necessitate an inhomogeneous SOVA detector. This will become clear later in a description of a sectioned SOVA detector provided further below.

Sectioned Soft-Output Viterbi Algorithm (S-SOVA)

In the above-described channel architecture, two different types of bits are involved. The first type is the RLL/RDS coded bits 904 directly transmitted through the channel, and also called NRZ states of magnetization in the media (channel bits). The bits of the second type are bits corresponding to the SSP decoded bits that participate in different parity check equations for multi-level coding (intermediate bits 924). Intermediate bits and channel bits can be translated from one type to another by a modem. Here, the following terminology is adopted. When intermediate bits are converted to channel bits, the modem is said to perform a direct operation. When channel NRZ bits are converted to intermediate bits, the modem is said to perform a reverse operation. Since channel bits are transmitted through the channel (written on the medium), but intermediate bits constitute all parity check equations involved in message passing algorithms, there is a need for a channel detector that receives equalized samples and returns hard and soft decisions regarding intermediate bits. Such detectors operating with groups of incoming and out-coming symbols are described below. Since these detectors operate based on trellises constructed from sections of conventional trellises, they are herein referred to as Sectioned SOVAs or S-SOVAs.

S-SOVA Algorithm Details

Figure 11:
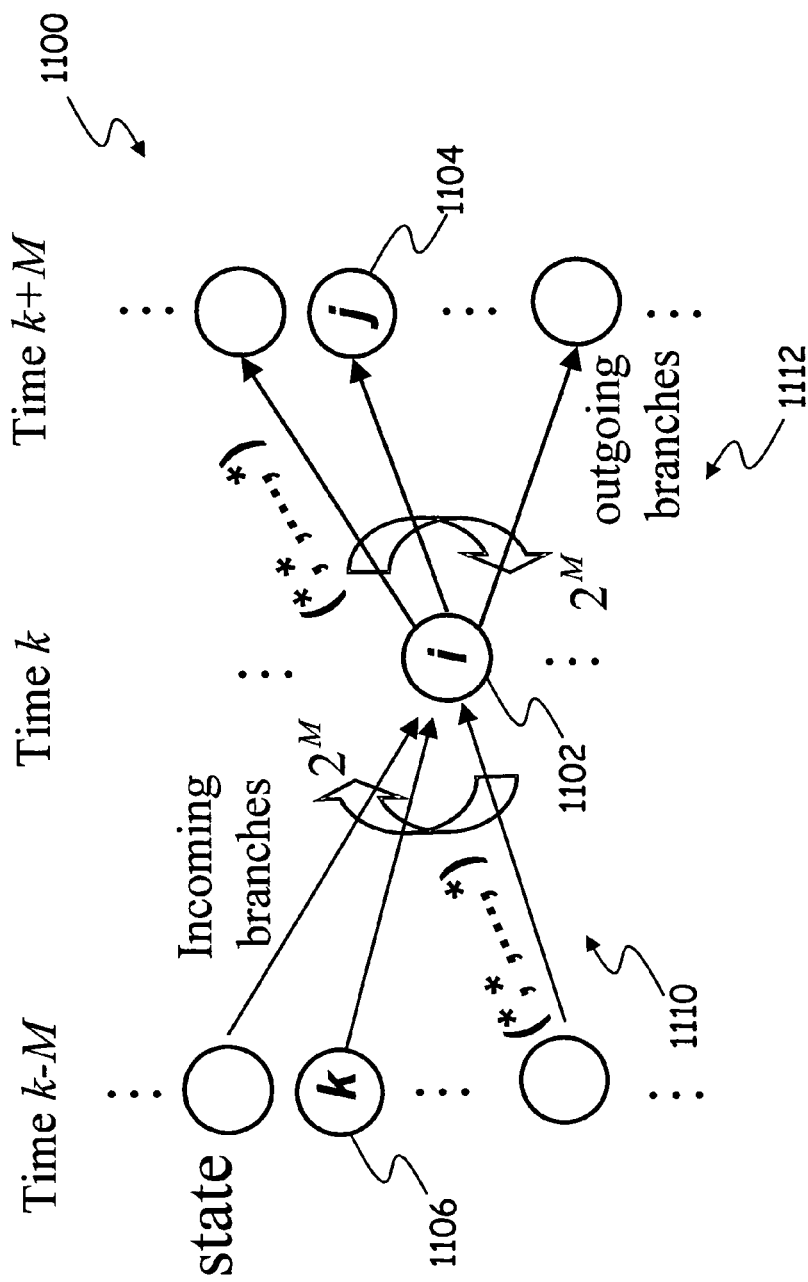
FIG. 11 is a diagrammatic illustration of a fragment of a Sectioned Soft-Output Viterbi Algorithm (S-SOVA) detector trellis where each state is associated with more than two incoming and outgoing branches.

A S-SOVA differs from a regular SOVA for a binary system in a manner in which its trellis is constructed and its path memories are updated. In a regular SOVA, a number of states is determined by a channel memory length desired, and each state has two outgoing branches and two incoming branches for binary systems. Specifically, if a desired channel memory length is L, then $Q=2^L$ states are required, and each state has two incoming and outgoing branches corresponding to two possible current input values. In the S-SOVA, the number of states remains the same, however, the number of incoming and outgoing branches are different. A group of M bits is considered as current input, and therefore each current input contains $2^M$ possibilities. Consequently, $2^M$ branches are leaving each state, as illustrated in trellis structure 1100 of FIG. 11. It should be noted that each branch can be represented by two types of bits, channel bits or intermediate bits. In FIG. 11, states such as i, j, and k are denoted by reference numerals 1102, 1104 and 1106, respectively. Incoming branches are denoted by reference numeral 1110 and outgoing branches are denoted by reference numeral 1112.

Figure 12:
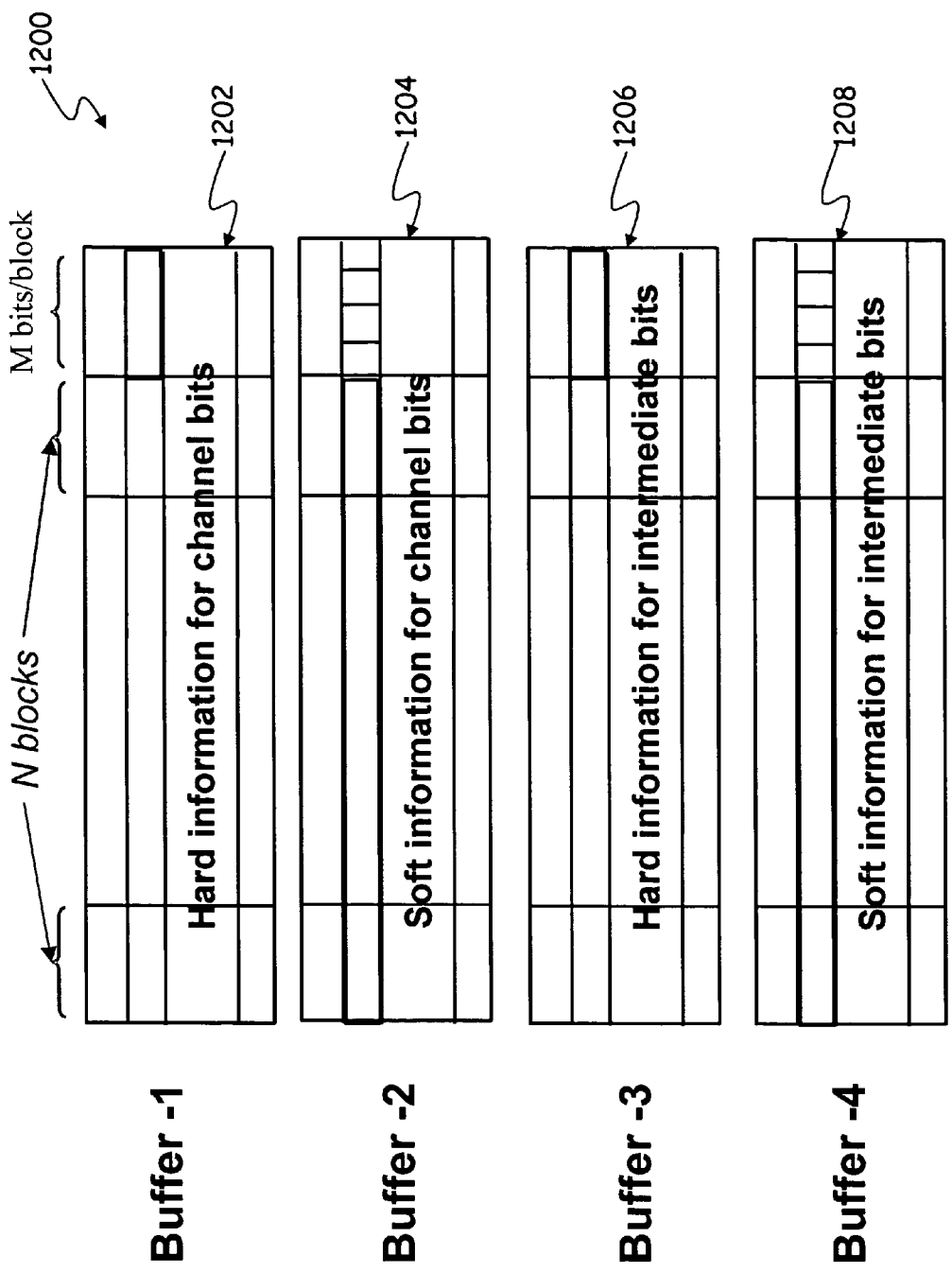
FIG. 12 is a diagrammatic illustration of an example of path memory buffers in a S-SOVA implementation.

A S-SOVA can maintain one or two pairs of path memory tables for storing hard and soft information, that is, one pair for storing hard and soft decisions regarding channel bits and another pair for storing hard and soft decisions regarding intermediate bits. FIG. 12 illustrates a structure 1200 of those tables. It should be noted that, for each state in the trellis, there is a corresponding row entry in each memory table storing hard or soft information regarding bits of survived paths. Each path memory table is updated upon receiving a new portion of M samples from an equalizer. The following generalized method can be used for this purpose.

Suppose that at a time moment k all path memory tables contain information regarding N bits, that is, they have a size Q×N, and new M samples are received from the channel. The SSOVA updates each row of the path memory table creating a new row with additional M entries. First, as in conventional Viterbi algorithm, for each state of the trellis, a survivor is defined by an Add-Compare-Select (ACS) unit. Consider that updating of a specific state S at a time moment k+M after receiving M new samples in the channel takes place using a conventional ACS unit or an advanced unit employing Data Dependant Noise Prediction (DDNP). This unit first defines a survivor state, that is, a state in the trellis at the time moment k which gives a minimum accumulated path metric for the given state S at the time moment k+M. All other states that are connected to S in the trellis corresponding to the time moment k are called competitors. Let $\Delta^0, \Delta^1, \ldots, \Delta^{2^M-1}$ be path metric differences between a metric of a survivor and metrics of competing branches defined for the state S at time moment k+M. All these metric differences are used for updating soft information of a row of path memory corresponding to state S as follows.

Let existing log-likelihood ratios (LLRs) for bit j of the survivor path terminated at state S be denoted by $L_j(S)$ and an associated hard decision by $u_j(S)$. A new or updated LLR $L_j'(S)$ for bit j can be is defined by the equation $$L_j'(S) = \min_{i=0,1,\ldots 2^M-1} f(L_j(i), \Delta^i) \text{ for } j \leq k \qquad \text{Equation 1}$$

where $$f(L_j(i), \Delta^i) = \begin{cases} L_j(i) + \Delta^i & \text{if } u_j(i) = u_j \\ \Delta^i & \text{if } u_j(i) \neq u_j \end{cases},$$

$L_j(i)$ and $u_j(i)$ are respectively soft and hard decisions regarding the j-th bit in the rows of path memory corresponding to the i-th competitor with metric difference $\Delta^i$, and $u_j$ is the hard decision regarding the j-th bit in the rows of path memory corresponding to the survivor. For the latest M bits, the reliability $L_j(S)$, $k<j\leq k+M$ is set by $$L_j(S) = \min_i(\Delta^i | u_j(i) \neq u_j) \text{ for } k < j \leq k+M,$$

where the minimization is over the incoming branches that have different decisions regarding the j-th bit from the survivor. The hard decisions $u_j(i)$ and $u_j$ are bit decisions corresponding to the incoming branch with metric difference $\Delta^i$ from the survivor for state S and the survivor itself, respectively.

It can be shown that such an updating rule converges to a Max-Log-MAP algorithm as a decision delay goes to infinity. In practice, the decision delay is always finite. However, numerical results show that a relatively small decision delay of 5 L, where L is the channel memory length, is sufficient to approach near optimal performance.

To generate hard and soft information for channel bits, memory buffers that store a path memory corresponding to channel bits are used. They are represented by Buffer-1 (denoted by reference numeral 1202) and Buffer-2 (denoted by reference numeral 1204) shown in FIG. 12. In Buffer-1, channel bits associated with the survivor path for each state at time instance k are saved in Buffer-1. The corresponding soft information is stored in Buffer-2. They are updated according to Equation 1 when a new section of samples are processed. While updating the soft information, hard decisions $u_j$ and $u_j(i)$ in Buffer-1 are used in Equation 1.

Similarly, to generate hard and soft information for intermediate bits, memory buffers that store path memory corresponding to intermediate bits are used. Recall that intermediate bits' and channel bits are related and can be translated via a SSP modem. Thus, the intermediate bits hard-decision table in Buffer-3 (denoted by reference numeral 1206) can be directly translated from Buffer-1 via a SSP reverse operation. For a section of input signal samples (in exact M samples), the algorithm recorded the survivor path for each state in the trellis, and the intermediate bits' hard decisions are kept in Buffer-3. Now, soft-information of intermediate bits in Buffer 4 (denoted by reference numeral 1208) are updated according to Equation 1, where $u_j$ and $u_j(i)$) are based bits saved Buffer-3 instead of Buffer-1.

Using a-priori Information in S-SOVA

When a-priori information is available to a S-SOVA, it can be utilized to refine the output, both for hard decisions and soft-output. Specifically, since a Viterbi algorithm is based on a maximum-likelihood principle, SOVA output relates to the likelihood probability of receiving r given that sequence b was transmitted P(r|b). To compute the max-a-posteriori (MAP) probability P(b|r) which minimizes the probability of error, a-priori information P(b) can be utilized via P(b|r)=P(r|b)+P(b). Consequently, any a-priori information can be used to adjust the branch metric calculation so that the output reflects the already-known knowledge. This is achieved by adjusting the branch metric calculation by $$PM^{(i)}(S) = PM(S^{(i)}) + BM^i + \sum_{l=1}^{M} P(b_{k+l})$$

where
$PM^{(i)}(S)$ is the accumulated path metric for state S at time k+M for the i-th incoming branch;
$PM(S^{(i)})$ is the accumulated path metric at time k for the state $S^{(i)}$ corresponding to the i-th incoming branch;
$BM^{(i)}$ is the branch metric of the i-th incoming branch; and
$P(b_j)$ is a-priori information of bit $b_j$.

A-priori information provided can be either for intermediate bits or for channel bits. When a-priori information for intermediate bits is provided, the interpretation of bits $b_j$ corresponding to an incoming branch should be based on intermediate bits, that is, contents in Buffer-3 in FIG. 12. Otherwise, if a-priori information for channel bits is provided, interpretation of bits corresponding to an incoming branch should be based on channel bits, that is, contents in Buffer-1 in FIG. 12.

Figure 13:
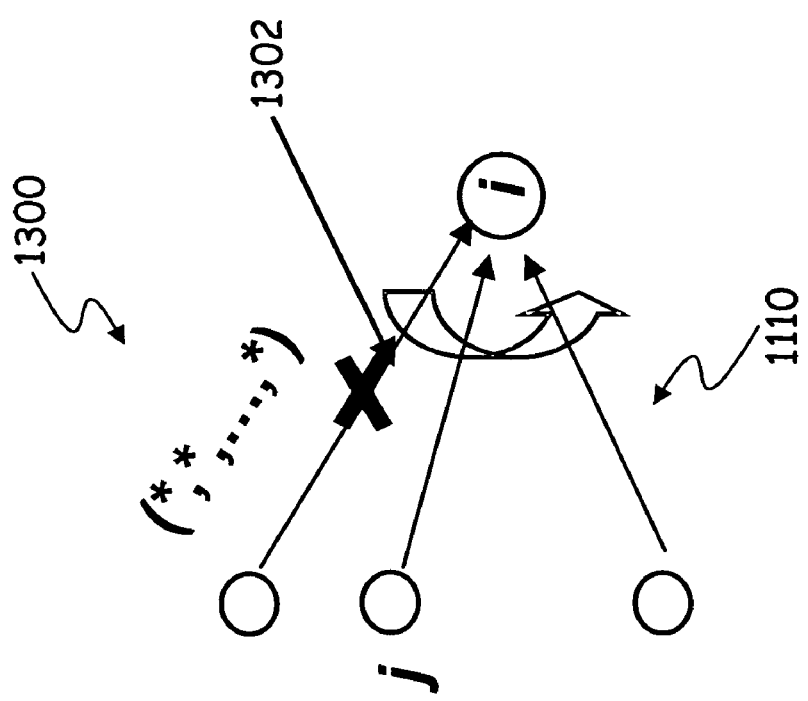
FIG. 13 is a diagrammatic illustration of a fragment of a channel trellis illustrating operation of an Add-Compare-Select (ACS) unit of a S-SOVA with an additional input receiving soft or hard side information regarding transmitted bits.

In some applications, a-priori information is provided as hard decisions. This is equivalent to knowing some bits in either intermediate bit format or in channel bit format. FIG. 13 is a fragment 1300 of a channel trellis illustrating operation of an Add-Compare-Select (ACS) unit of a Sectioned SOVA with an additional input receiving hard decisions regarding transmitted bits from preceding code detectors. This type of channel detector is a modification of a conventional Viterbi algorithm, SOVA or S-SOVA, and can be employed on the second or higher stages of decoding, when some data is already recovered by the use of powerful codes. This recovered data is entered as side information, and the ACS unit is required to discard branches in the trellis if corresponding labels do not match side information. The discarding of an incoming branch if bits (represented by *, *, . . . , *, in FIG. 13) of the incoming branch do not match side information is denoted by reference numeral 1302.

Homogeneous and Inhomogeneous S-SOVA

As stated, a SOVA algorithm can output hard-decisions and its corresponding reliabilities in terms of soft-information either for intermediate bits or channel bits. This can be generalized by considering cases where intermediate bits and channel bits are related via a generic modem. A $1/(1 \oplus D)$ precoder can be considered as a special case of a generic modem. Conventionally, it is assumed that all bits within a data sector are encoded using the same type of modem, and the SOVA algorithm outputs hard and soft information either for channel bits or intermediate bits. In other words, the output is homogeneous throughout the sector.

In the proposed S-SOVA architecture, however, it is capable of generating four different outputs. They are hard decisions for channel bits and intermediate bits, as well as their corresponding reliability information. In a practical implementation, not all four types of outputs are necessary. Consequently, not all four buffers shown in FIG. 12 are necessary. In one embodiment, for example, the S-SOVA outputs hard decisions for channel bits with soft outputs corresponding to intermediate bits.

In addition, it is possible that the soft output required includes both intermediate bits and channel bits. For example, for the channel encoding architecture in FIG. 9, parity bits participating in parity check equations are not SSP coded. The iterative decoder thus anticipates soft-information corresponding to intermediate bits for RLL/RDS coded data bits and soft-information corresponding to channel bits for parity bits. The S-SOVA can thus be configured such that it can switch soft output modes between intermediate bits and channel bits. Such a configuration is termed as an inhomogeneous S-SOVA.

High-Rate Turbo-Product Codes

A turbo product code is defined by a multidimensional array of code words from linear block codes, such as parity check codes, Hamming codes, BCH (Bose, Ray-Chaudhuri, Hocquenghem) codes, etc. The simplest type of TPC is a two-2-dimensional TPC with a single-parity bit per row and column (TPC/SPC). A TPC with multiple parities (TPC/MPC) are similar to TPC/SPC codes with the exception that there are multiple parity bits row-wise or column-wise, which lends more flexibility in code structure, code rate and code length. In general, a 2-dimensional multi-parity turbo product code (TPC/MPC) is constructed from two linear binary block codes $C_1$ and $C_2$ with parameters $(n_1, k_1, d_1)$ and $(n_2, k_2, d_2)$, where $n_i$, $k_i$, i=1,2, are a code word length, a user data block length and a minimum distance, respectively. A 2-dimensional turbo product code $C=C_1 \times C_2$ has parameters (n, k, d), where $n=n_1 \cdot n_2$, $k=k_1 \cdot k_2$, and $d \geq d_1 d_2$. Its generator matrix is a Kronecker product of generator matrices of its component codes. In the case of TPC/SPC, each row and each column satisfies a single-parity check, and the minimum distance for an m-dimensional TPC/SPC is 2 m.

Figure 14:
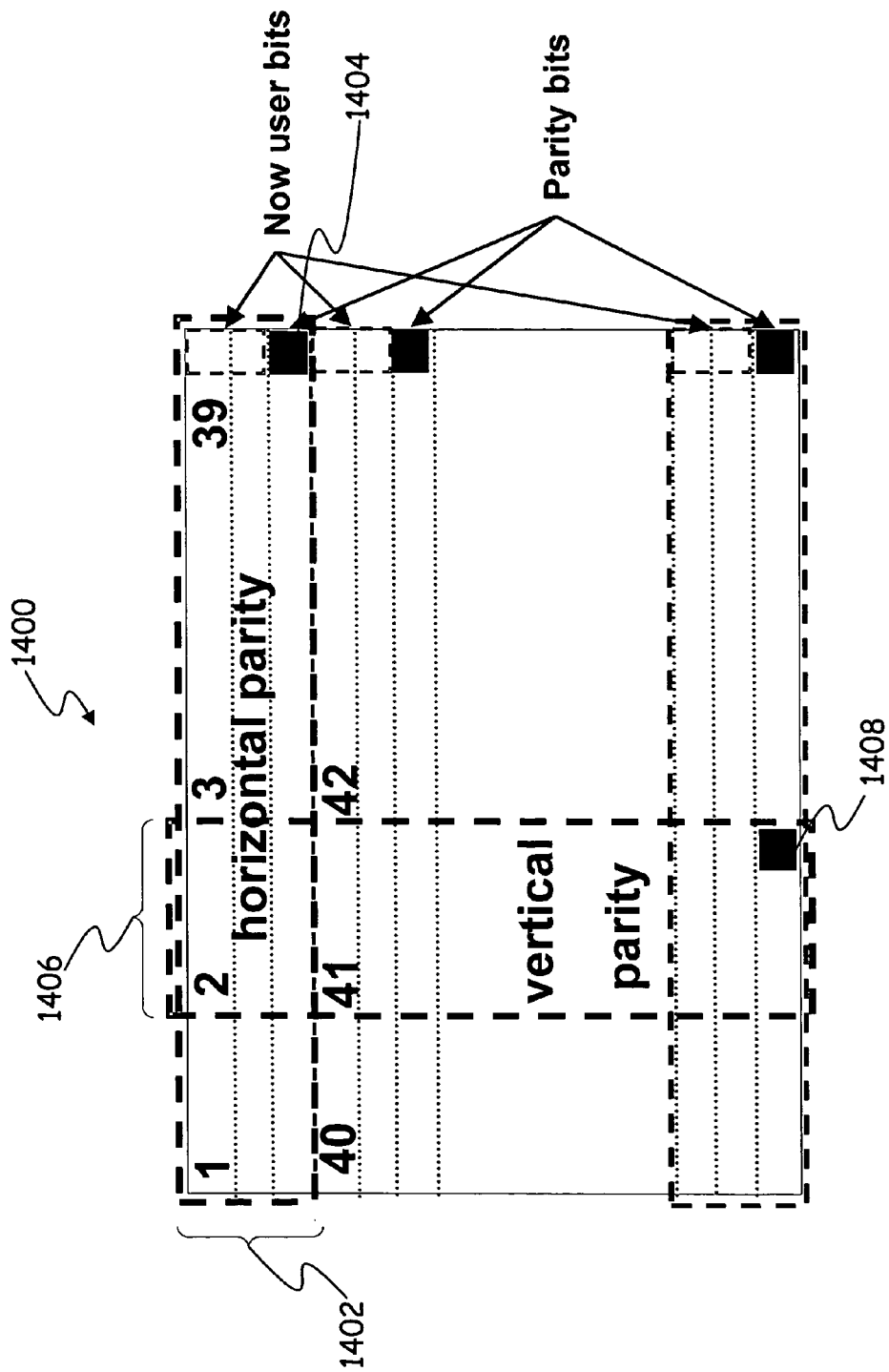
FIG. 14 is a diagrammatic illustration of an encoding structure of a high-rate TPC.

Since some of the present embodiments target applications in data storage systems, all TPC/SPC and TPC/MPC codes used are 2-dimensional for the sake of higher rates. This is important since the code rate loss in data storage systems is hard to compensate if the code rate is not high enough. Further, both row and column codes of a TPC should be chosen the same to save hardware cost in a real implementation. To further increase the rate of the TPC/SPC, multiple rows and columns of a data array can be included to one parity check equation. FIG. 14 illustrates this principle in the form of an example high rate TPC encoding structure 1400. In this figure, the first three rows 1402 constitute the first horizontal parity check equation, and contain only one parity bit shown as black cell 1404 in the right bottom corner of these lines. It should be noted that a conventional TPC would have 3 parity bits. The second group of three lines will have another parity bit, and so on. Vertical group parities (denoted by reference numerals 1406 and 1408) are defined in exactly the same manner as horizontal group parities except that columns are used instead of rows.

If $v$ rows are included in one horizontal parity, and $\mu$ columns are included in one vertical parity, then the total redundancy is $m=(k_1/v)+(k_2/\mu)$, and the code rate $R=(n-m)/n$ which can be made larger than the rate of the conventional TPC at the expense of the decreased error correction capability. Still these codes allow decoding with multiple local iterations and for this reason can be more powerful than simple one-dimensional SPC codes. These codes are referred to herein as High Rate (HR) TPC, or simply HR-TPC.

When decoded in an iterative manner, for example, using MPA, after a channel detector of a Viterbi type, such as SOVA or S-SOVA, the bits of HR-TPC are to be transmitted in a special order, in other words interleaved to spread bursts of channel errors through different parity check equations.

Decoding Methods and Apparatus

Figure 15:
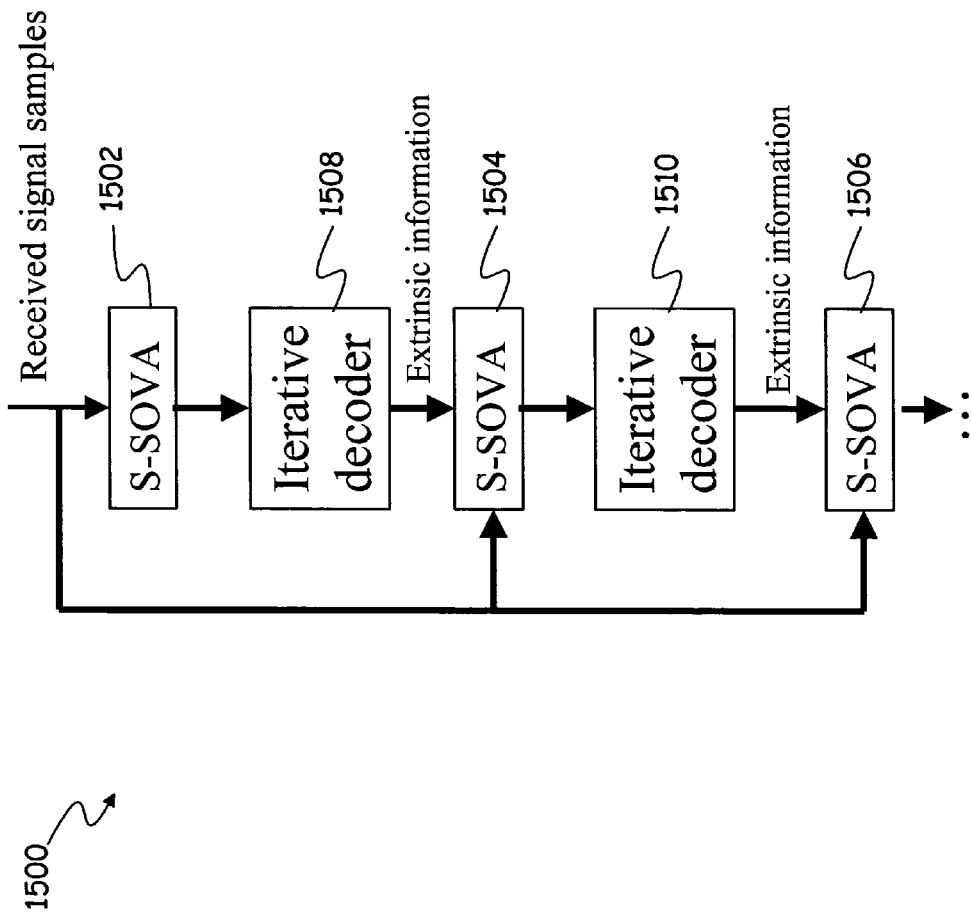
FIG. 15 is a diagrammatic illustration of a pipelined decoding architecture for an iteratively coded system with coded modulation.

FIG. 15 illustrates a decoder architecture 1500, which includes multiple S-SOVAs 1502, 1504 and 1506 and iterative decoders 1508 and 1510. Received signals are first processed by S-SOVA 1502, which generates soft information for bits participating in iterative code parity check equations. This step is followed by iterative decoding by iterative decoder 1508 utilizing a S-SOVA output. The iterative decoder 1508 subsequently generates extrinsic information, which becomes a-priori information for the second S-SOVA 1504. The second S-SOVA 1504 processes the received signal samples again, but with a-priori information from the iterative decoder 1508, and generates a refined soft-output for the second iterative decoder 1510. This process is repeated until predefined criteria of termination are reached. The final output can be taken either from a S-SOVA, or an iterative decoder.

Figure 16:
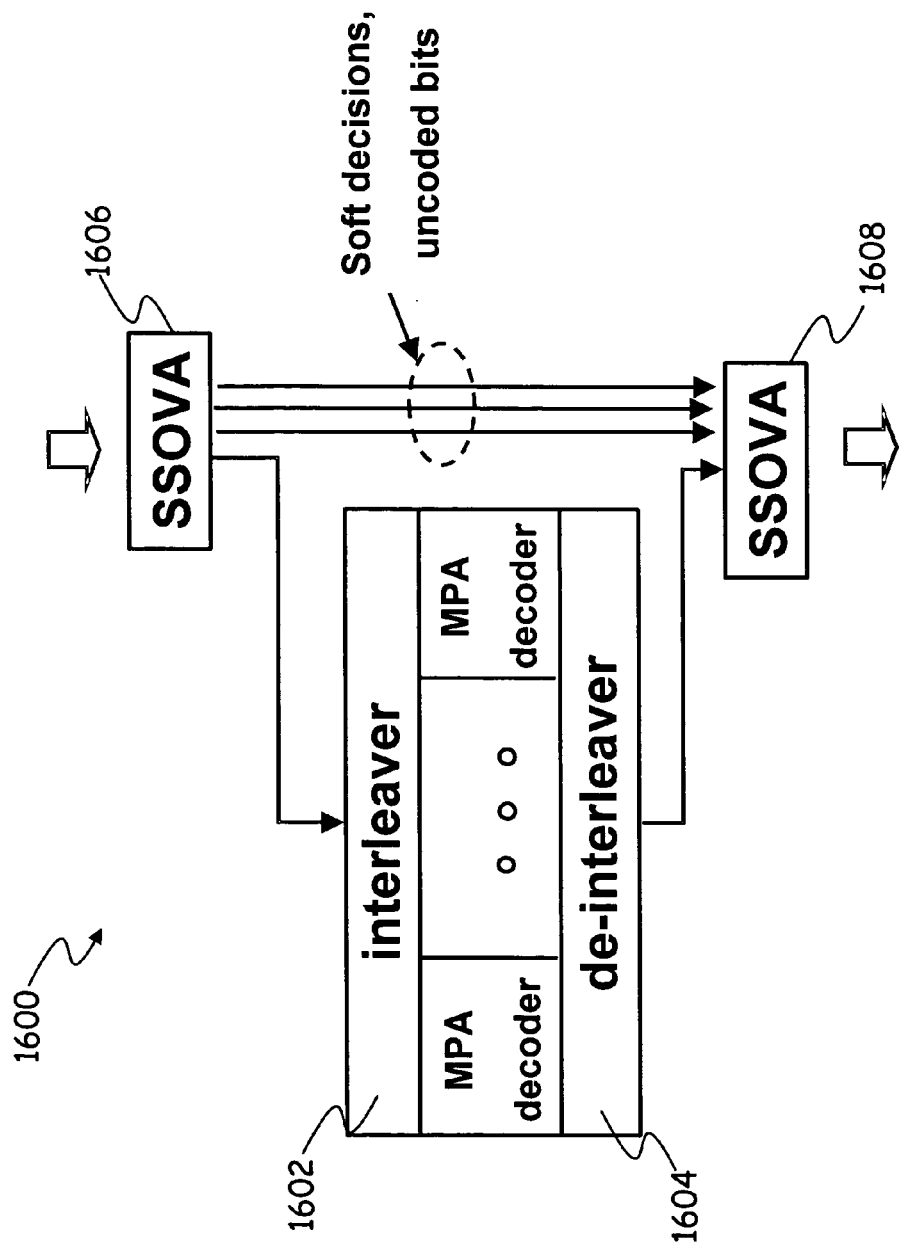
FIG. 16 is a simplified block diagram of a decoding part of an iterative channel illustrating interaction of channel detectors (S-SOVAs) with single or multiple local code Message Passing Algorithm (MPA) detectors through an interleaver and a de-interleaver.

FIG. 16 is a simplified block diagram 1600 that illustrates the use of an interleaver 1602 and a de-interleaver 1604 between channel detector 1606 and code detector 1608. It also shows that multiple codes can be used to protect each single or group of rows in a matrix of intermediate bits.

Figure 17:
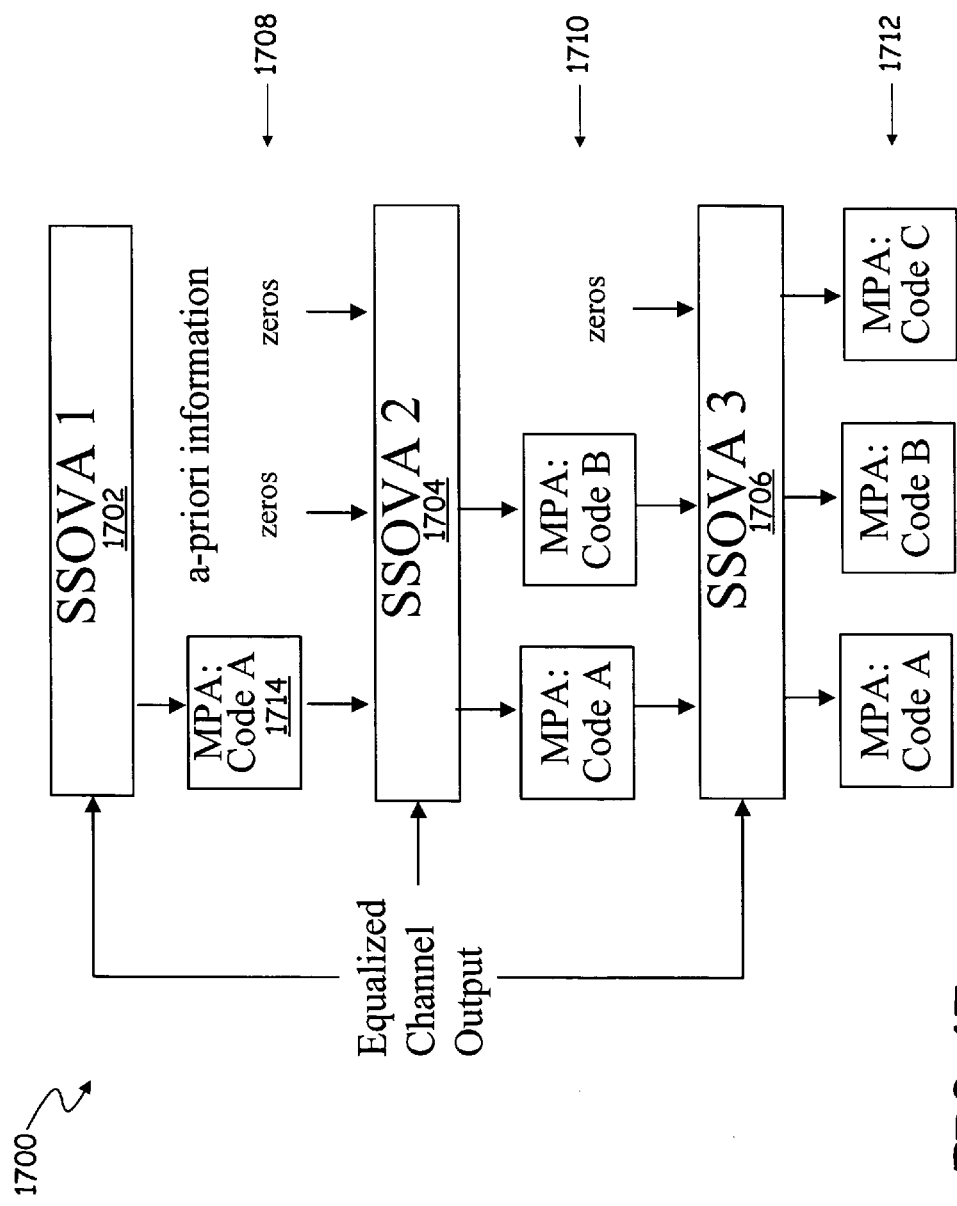
FIG. 17 is a simplified block diagram of a receiver side of a pipelined iterative channel including three channel detectors (S-SOVAs) and three types of soft code detectors implementing MPAs for channel codes A, B and C, respectively.

FIG. 17 shows a block diagram of a pipelined decoder 1700 for the coded data array shown in FIGS. 5 and 6. This illustrative example uses three channel detectors denoted as S-SOVA 1 (1702), S-SOVA 2 (1704), and S-SOVA 3 (1706) and three iterative decoders 1708, 1710 and 1712. The final output is obtained from the output of iterative decoder 1712, although a more frequent practice for magnetic recording channels is to take outputs from the last S-SOVA detector.

First, the received (equalized) signal samples are processed by a channel sequence detector S-SOVA 1. The outputs of S-SOVA 1 are hard decisions regarding intermediate bits and corresponding reliabilities of these decisions. At this stage of decoding, usually there are a relatively large number of channel errors at the output of the channel detector (S-SOVA 1), and only the most powerful code A protecting the first line of an intermediate array is used for updating a soft output of the channel detector. This is done by an MPA decoder shown in the figure as MPA: code A (1714). Non-zero a-priori information on bits of the first line is obtained, and used as an input of channel detector S-SOVA 2.

At a second stage, using a-priori information on bits of the first line, second channel detector S-SOVA 2 again produces hard and soft decisions regarding the intermediate bit array, but this time the number of bit errors is much less than the number produced at the output of S-SOVA 1. As a result, code B can update soft decisions regarding the second or third line of the intermediate bit array. The code A is also used. A-priori information on the first and second (or third) line is sent to the last channel detector S-SOVA 3.

At a third stage, using a-priori information on the bits of the first and second lines of channel detector S-SOVA 3 produces new hard and soft decisions regarding the intermediate bit array and, as before, a number of bit errors is much less than the number produced at the output of the S-SOVA 2. As a result, the code C can update soft decisions regarding the second or third line of the intermediate bit array. Code A and B are also used. Finally, the decoder outputs decoding results from these iterative decoders.

One possible modification of the described example above is to use code C already after S-SOVA 2. Another possible modification of the described example is to use all the codes A, B, and C throughout the decoding process, that is, after S-SOVA1, S-SOVA2 and S-SOVA 3.

Figure 18:
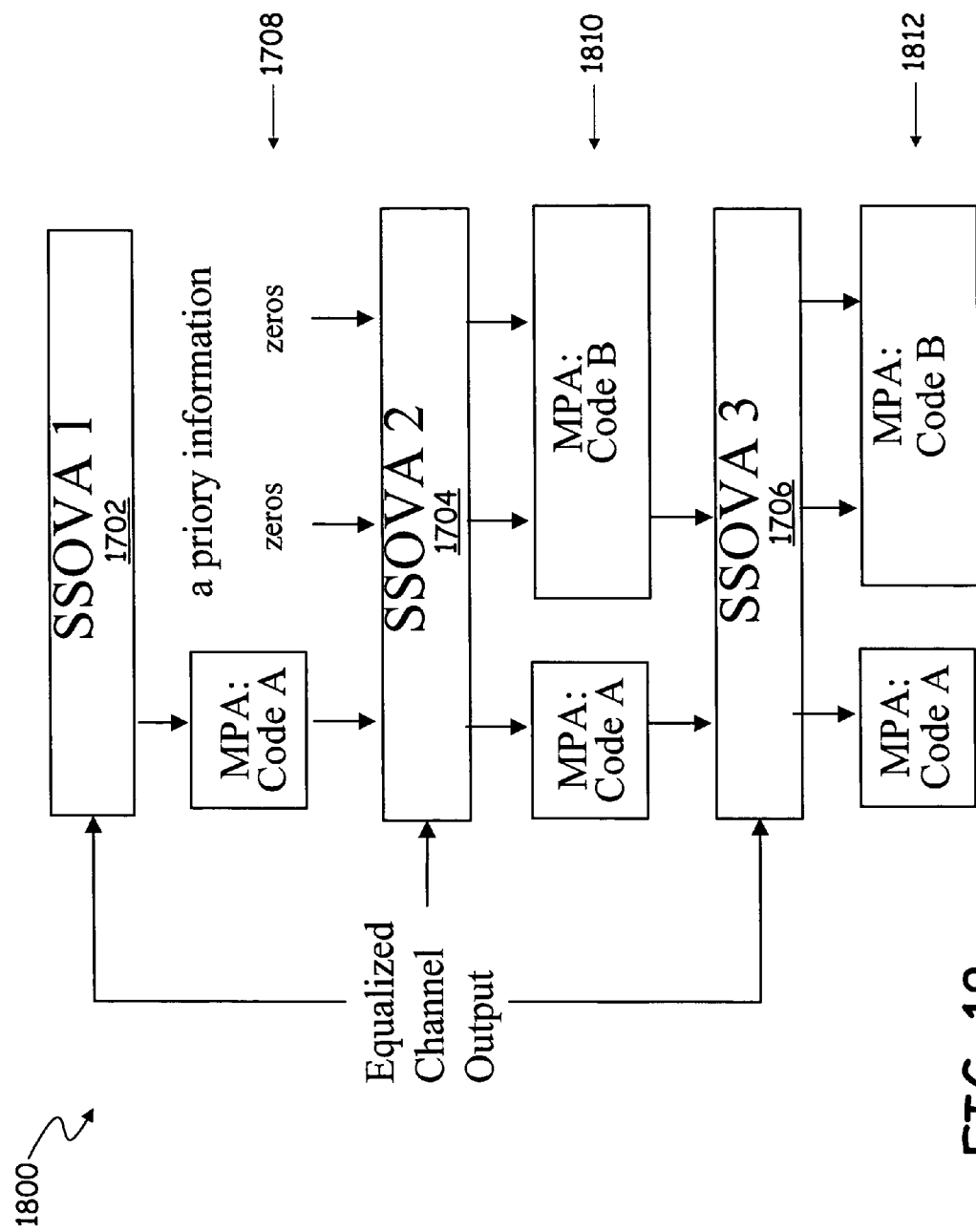
FIG. 18 is a simplified block diagram of a receiver side of a pipelined iterative channel including three channel detectors (S-SOVAs) and two types of soft code detectors implementing an MPA for channel code A and channel code B.

FIG. 18 shows a block diagram of a pipelined decoder 1800 for the coded data array shown in FIG. 8. In this case, only 2 codes A and B are used. The code A protects the first line of the array of intermediate bits while the second code B covers the second and the third line. Thus, iterative decoders 1810 and 1812 differ from iterative decoders 1710 and 1712, respectively, of FIG. 17.

As in the previous example, the received (equalized) noisy signal is first processed by a channel sequence detector S-SOVA 1. The outputs of S-SOVA 1 are hard decisions regarding intermediate bits and corresponding reliabilities of these decisions. Again, there are a relatively large number of channel errors at the output of the channel detector (S-SOVA 1), and therefore only the most powerful code A protecting the first line of an intermediate array is used for updating a soft output of the channel detector. This is done by the MPA decoder shown in the figure as MPA: code A. Non-zero a-priori information on bits of the first line are obtained and used as an input of the channel detector S-SOVA 2.

At a second stage, using a-priori information on the bits of the first line, second channel detector S-SOVA 2 produces new hard and soft decisions regarding the intermediate bit array, but this time a number of bit errors is much less than at the output of S-SOVA 1. As a results code B is used to update soft decisions regarding the second and third line of the intermediate bit array. A-priori information on the first, second and the third lines is sent to the next channel detector S-SOVA 3. The third and other subsequent stages are similar to the second stage.

In another embodiment, both code A and code B are used to update the soft output of the channel detectors (S-SOVA 1, S-SOVA 2, S-SOVA 3).

Results of Tests and Simulations

Simulations are performed according to the proposed encoding/decoding architecture with coded modulation for perpendicular magnetic recording channels. A conventional TPC coded iterative system is set up as the baseline system for performance comparison purposes.

Specifically, a data sector including 4800 ECC coded bits is de-interleaved and encoded with 3 TPC/SPC code words of code word size 41 by 41. There are total 81*3=243 parity bits, which are concatenated with the original 4800 bits and transmitted to the channel. A de-precoder 1⊕D and a precoder 1/(1⊕D) are inserted before the de-interleaver and after the TPC/SPC encoding to further improve performance.

The coded modulation system is configured as a 3-level SSP. The MLC coding structure is shown in FIG. 8. The low rate TPC includes four 21×21 short TPC code words. An interleaver of size 1600 is used for the 1600 bits in the first row. The last two rows of the code matrix is coded with two 41 by 41 TPC/SPC code words and an interleaver of size 3200 is used for encoding. The parities are 1/(1⊕D) coded, concatenated with the original 4800 bits, and transmitted to the channel.

Other system configurations are identical to the two systems above. Channel bit densities are adjusted to reflect the overall code rates (ECC and TPC/SPC) with user bit linear density fixed at 2.0. Jitter noise is assumed to be dominant and accounts for 90% of the system noise. A 21-tap MMSE equalizer with a fixed target of length 3 is used for front-end equalization, and uniform sampling is assumed for timing recovery. A S-SOVA detector with DDNP is used. There are a total of 16 different 3-tap noise whitening filters used for data dependent noise prediction. It should be noted that the S-SOVA detector is able to generate soft-information for the intermediate bits as well as the channel bits.

Figure 19:
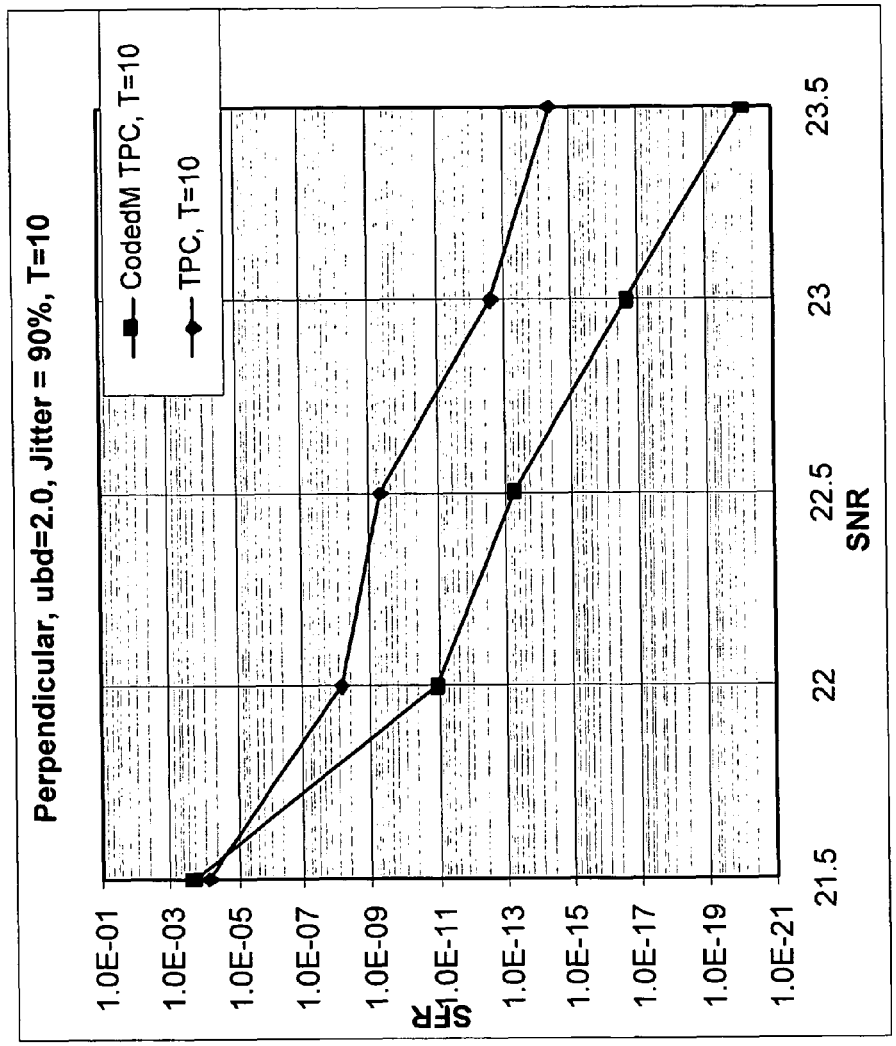
FIG. 19 is a graph of Sector Failure Rates (SFR) versus Signal-to-Noise Ratio (SNR) characteristics of a perpendicular magnetic recording channel for iterative systems with and without coded modulation at Reed-Solomon (RS) error correction capability T=10.

FIG. 19 illustrates the estimated sector failure rate (SFR) results for the baseline TPC system, in comparing to the iterative system with coded modulation. Clearly, the coded modulation system out performs the conventional TPC system with 0.75 dB SNR gains at SFR $10^{-15}$, or more than a 5 decade SFR gain at SNR 23.5 dB.

Figure 20:
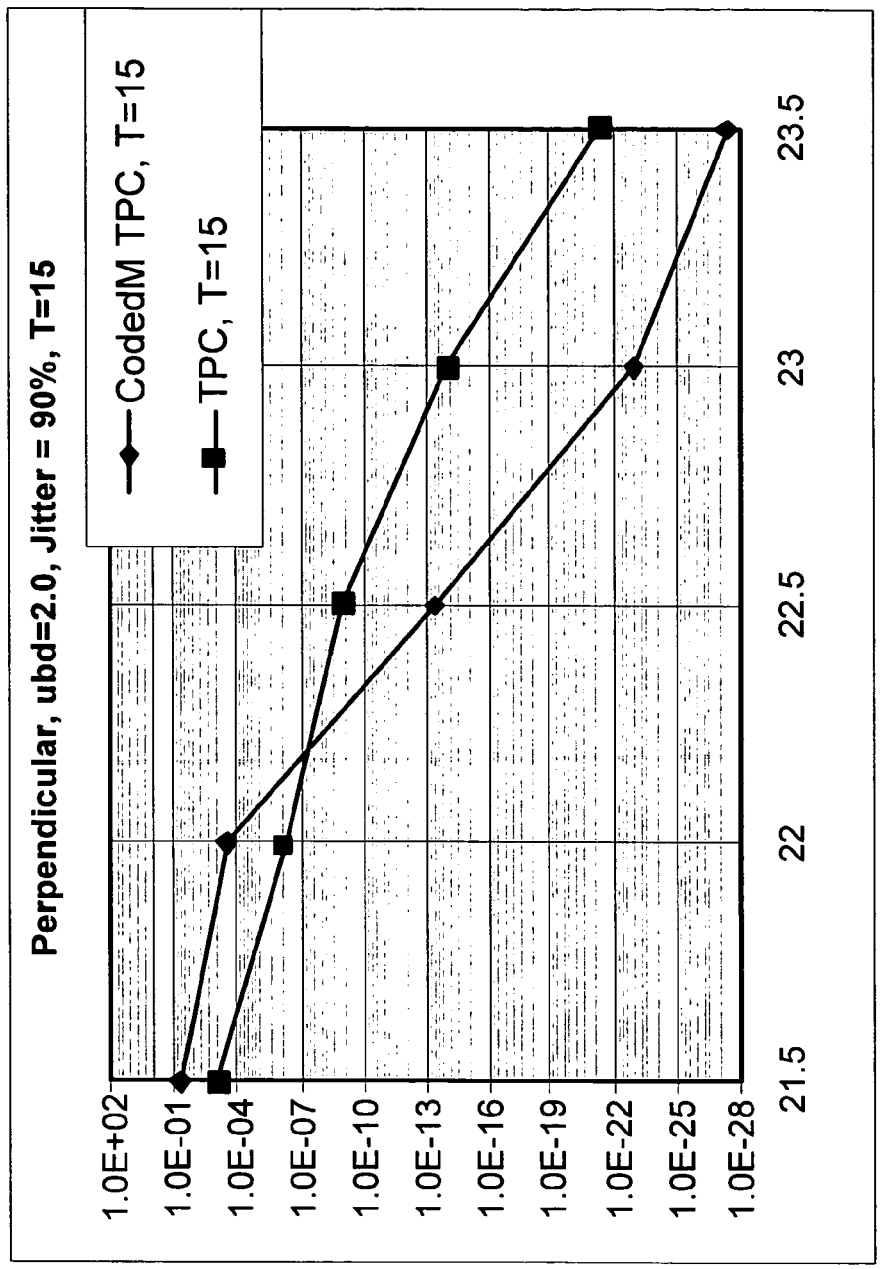
FIG. 20 is a graph of SFR versus SNR characteristics of a perpendicular magnetic recording channel for iterative systems with and without coded modulation at RS error correction capability T=15.
Figure 21:
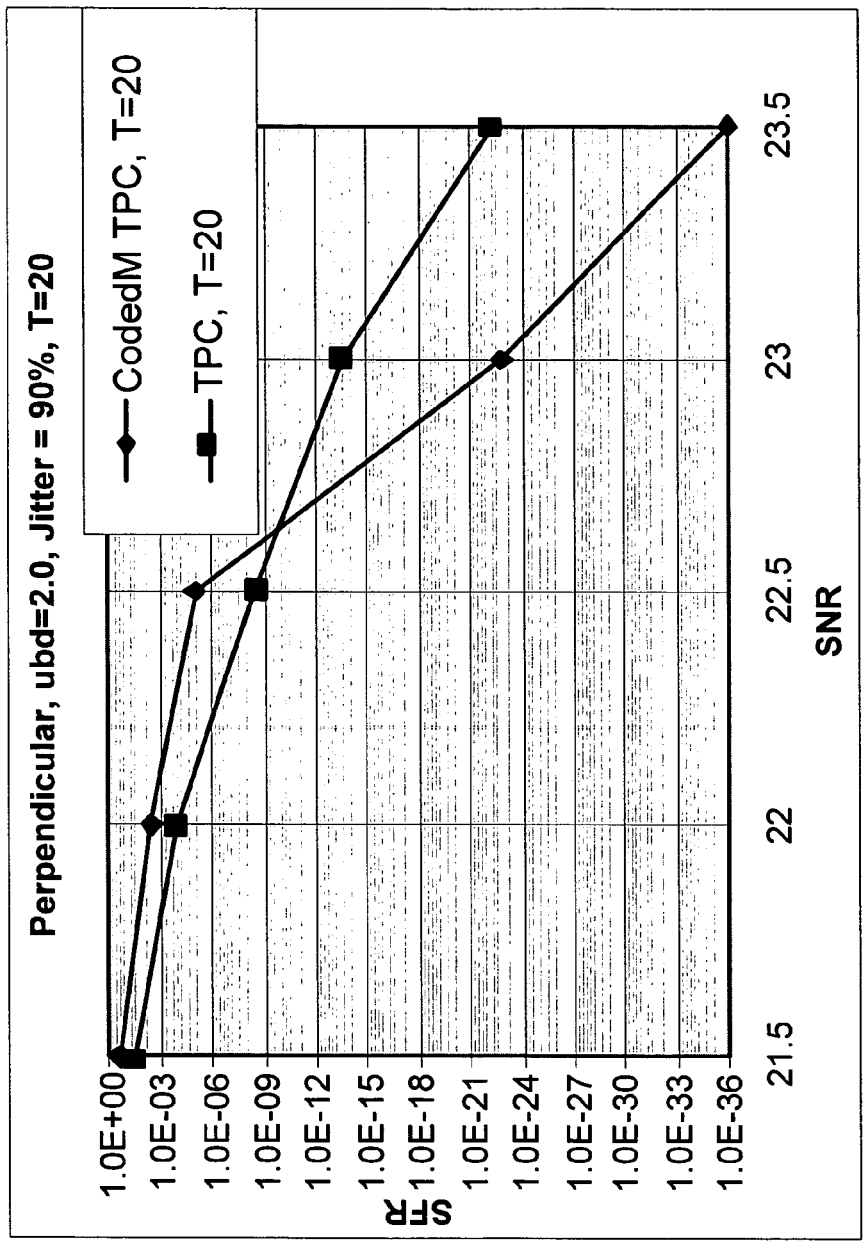
FIG. 21 is a graph of SFR versus SNR characteristics of a perpendicular magnetic recording channel for iterative systems with and without coded modulation at RS error correction capability T=20.

It should be noted that, in practical systems, system optimization should be performed for the desired operating conditions. Specifically, the tradeoffs between reliability, robustness and complexity should be carefully considered. From a signal processing/coding perspective, it is often directly translated into the overall code rate desired. For example, FIGS. 20 and 21 illustrate cases when more redundancy is imposed on Reed-Solomon codes. FIG. 20 corresponds to an error correction level T=15 and FIG. 21 corresponds to T=20 for both the TPC coded system and coded modulation system. It is observed that in both cases coded modulation systems out perform conventional TPC systems at modest to high SNR regions. For example, at SNR 23.5 dB, the estimated SFR for coded modulation is 6-decade better than conventional TPC systems at T=15. While, for T=20, this gain is expanded to more than 10-decade. However, it should be also noted that the waterfall region for coded modulation system is postponed comparing to the conventional TPC system as overall code rates increase. Clearly, for practical implementations, code selection needs to be optimized for a given physical system to maximize the SNR gains offered by coded modulation.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoding and decoding system while maintaining substantially the same functionality without departing from the scope and spirit of the present invention. In addition, although the preferred embodiments described herein are directed to iterative read channel architectures with coded modulation for data storage devices, it will be appreciated by those skilled in the art that the teachings of the present invention can be applied to other binary communication channels, without departing from the scope and spirit of the present invention.

What is claimed is:

1. An encoder comprising:
 a first encoding component, which comprises an Error Correcting Code (ECC) encoder and a first constraint encoder, configured to receive user information bits and to responsively output a first constraint encoded bit sequence corresponding to the user information bits;
 a second encoding component configured to receive the first constraint encoded bit sequence, responsively generate parity bits, and encode them to produce a second constraint encoded bit sequence; and
 a multiplexer configured to combine the first constraint encoded bit sequence and the second constraint encoded bit sequence.

2. The apparatus of claim 1 wherein the first constraint encoder is one of a Run Length Limiting (RLL) type encoder, a Running Digital Sum limiting (RDS) type encoder or a Direct Current Free (DCF) type encoder.

3. The apparatus of claim 1 wherein the multiplexer is a concatenator.

4. The apparatus of claim 1 wherein the second encoding component comprises a first Structured Set Partitioning (SSP) modem, a permuter, a channel multi-level encoder and a second constraint encoder.

5. The apparatus of claim 4 wherein the first SSP modem receives the first constraint encoded bit sequence and responsively generates an intermediate bit sequence.

6. The apparatus of claim 4 wherein the second encoding component further comprises a second SSP modem.

7. The apparatus of claim 6 wherein the second constraint encoded bit sequence is also encoded by the second SSP modem.

8. An encoding and decoding system comprising the encoder of claim 1.

9. The system of claim 8 and further comprising:
 a data detector comprising:
  at least one Sectioned Soft-Output Viterbi Algorithm (S-SOVA) detector for processing channel bits and intermediate bits, the S-SOVA detector comprising:
   a path memory structure utilized for updating hard information and soft information for the channel bits and the intermediate bits.

10. The system of claim 9 wherein the path memory structure comprises:
 a first buffer memory configured to store hard information for the channel bits;

a second buffer memory configured to store soft information for the channel bits;

a third buffer memory configured to store hard information for the intermediate bits; and a fourth buffer memory configured to store soft information for the intermediate bits.

11. The system of claim 9 wherein the at least one S-SOVA detector is configured to utilize a-priori information to refine its hard decision outputs and soft decision outputs.

12. The system of claim 9 wherein the at least one S-SOVA is a homogeneous S-SOVA.

13. The system of claim 9 wherein the at least one S-SOVA is an inhomogeneous S-SOVA.

14. The system of claim 9 and further comprising at least one Message Passing Algorithm (MPA) decoder.

15. The system of claim 9 and further comprising an interleaver and a de-interleaver.

16. A disc drive comprising the encoding and decoding system of claim 9.

17. A multi-level encoder comprising:
a plurality of encoders with each encoder configured to receive an input data matrix and to generate encoded output data bits which are a function of at least one of columns or rows of input data bits of the input data matrix and prior output data bits,
wherein each of the plurality of encoders is configured to generate the encoded output data bits by:
including at least one of a single row parity bit for multiple rows of the input data matrix or a single column parity bit for multiple columns of the input data matrix.

18. A disc drive comprising the multi-level encoder of claim 17.

* * * * *